(12) United States Patent
Kim

(10) Patent No.: US 12,159,576 B2
(45) Date of Patent: Dec. 3, 2024

(54) DISPLAY DEVICE

(71) Applicant: Samsung Display Co., Ltd., Yongin-si (KR)

(72) Inventor: Keun Woo Kim, Seongnam-si (KR)

(73) Assignee: Samsung Display Co., Ltd., Yongin-si (KR)

(*) Notice: Subject to any disclaimer, the term of this patent is extended or adjusted under 35 U.S.C. 154(b) by 457 days.

(21) Appl. No.: 17/454,973

(22) Filed: Nov. 15, 2021

(65) Prior Publication Data

US 2022/0301505 A1 Sep. 22, 2022

(30) Foreign Application Priority Data

Mar. 22, 2021 (KR) .......................... 10-2021-0036589

(51) Int. Cl.
G09G 3/3233 (2016.01)
G09G 3/3225 (2016.01)
(Continued)

(52) U.S. Cl.
CPC ....... G09G 3/3233 (2013.01); H10K 59/1213 (2023.02); H10K 71/00 (2023.02);
(Continued)

(58) Field of Classification Search
CPC .............. H10K 59/1213; H10K 59/131; H01L 27/1214; H01L 29/42384; H01L 29/78696;
(Continued)

(56) References Cited

U.S. PATENT DOCUMENTS

| 2005/0056846 | A1 | 3/2005 | Huang et al. | |
| 2018/0337288 | A1* | 11/2018 | Shin | G09G 3/3233 |
| 2020/0027939 | A1* | 1/2020 | Cho | H10K 59/126 |

FOREIGN PATENT DOCUMENTS

| KR | 10-1640192 B1 | 7/2016 |
| KR | 10-1713994 B1 | 3/2017 |
| KR | 10-2021-0144991 | 12/2021 |

OTHER PUBLICATIONS

Ma, Ming-Wen, et al., "Impacts of Fluorine Ion Implantation With Low-Temperature Solid-Phase Crystallized Activation on High-k LTPS-TFT," IEEE Electron Device Letters, vol. 29, No. 2, Feb. 2008, pp. 168-170.

(Continued)

*Primary Examiner* — Sonya McCall-Shepard
(74) *Attorney, Agent, or Firm* — Lewis Roca Rothgerber Christie LLP

(57) ABSTRACT

A display device includes a first transistor configured to control a driving current flowing from a first electrode to a second electrode according to a voltage applied to a gate electrode of the first transistor, and a second transistor between the second electrode of the first transistor and the gate electrode of the first transistor, the second transistor including a first sub-transistor and a second sub-transistor. A same scan signal is to be transmitted to a gate electrode of the first sub-transistor and a gate electrode of the second sub-transistor. A gate insulating layer of the first sub-transistor includes a first thickness. A gate insulating layer of the second sub-transistor includes a second thickness smaller than the first thickness.

20 Claims, 15 Drawing Sheets

(51) Int. Cl.
| | |
|---|---|
| *G09G 3/3241* | (2016.01) |
| *G09G 3/3266* | (2016.01) |
| *G09G 3/3275* | (2016.01) |
| *H01L 27/12* | (2006.01) |
| *H01L 29/423* | (2006.01) |
| *H01L 29/786* | (2006.01) |
| *H10K 59/12* | (2023.01) |
| *H10K 59/121* | (2023.01) |
| *H10K 59/131* | (2023.01) |
| *H10K 71/00* | (2023.01) |

(52) U.S. Cl.
CPC ............... *G09G 2300/0819* (2013.01); *H01L 29/42384* (2013.01); *H01L 29/78696* (2013.01); *H10K 59/1201* (2023.02)

(58) Field of Classification Search
CPC ..... H01L 21/823462; H01L 21/823857; H01L 27/1237
See application file for complete search history.

(56) References Cited

OTHER PUBLICATIONS

Hong, Seonghwan, et al., "Alleviation of Recoverable Residual Image Phenomenon of Flexible Organic Light-emitting Diode Display," SID 2019 Digest, pp. 105-108.

\* cited by examiner

DISPLAY DEVICE

CROSS-REFERENCE TO RELATED APPLICATION

This application claims priority to and the benefit of Korean Patent Application No. 10-2021-0036589 filed on Mar. 22, 2021 in the Korean Intellectual Property Office (KIPO),the entire content of which is incorporated by reference herein.

BACKGROUND

1. Field

The present disclosure generally relates to a display device.

2. Description of the Related Art

As the information society develops, demand for display devices (e.g., display devices for displaying images) in various forms is increasing. For example, display devices are being applied to various electronic devices such as smartphones, digital cameras, notebook computers, navigation devices, and smart televisions.

Display devices are becoming increasingly important with the development of multimedia. Accordingly, various types of display devices such as liquid crystal displays and organic light emitting displays are being used. Among them, an organic light emitting display displays an image using an organic light emitting element that generates light through recombination of electrons and holes. The organic light emitting display includes a plurality of transistors that provide a driving current to the organic light emitting element.

SUMMARY

Aspects of one or more embodiments of the present disclosure are directed toward a display device having an improved medium/long-term image sticking figure of merit (ISFOM).

However, aspects of the present disclosure are not limited to the one set forth herein. The above and other aspects of the present disclosure will become more apparent to one of ordinary skill in the art to which the present disclosure pertains by referencing the detailed description of the present disclosure given below.

According to an embodiment of the present disclosure, a display device includes a first transistor configured to control a driving current flowing from a first electrode to a second electrode according to a voltage applied to a gate electrode of the first transistor, and a second transistor between the second electrode of the first transistor and the gate electrode of the first transistor, the second transistor including a first sub-transistor and a second sub-transistor. A same scan signal may be transmitted to a gate electrode of the first sub-transistor and a gate electrode of the second sub-transistor. A gate insulating layer of the first sub-transistor includes a first thickness. A gate insulating layer of the second sub-transistor includes a second thickness smaller than the first thickness.

The gate electrode of the first sub-transistor may be formed of a first conductive layer. The gate electrode of the second sub-transistor may be formed of a second conductive layer different from the first conductive layer.

The gate insulating layer of the first sub-transistor and the gate insulating layer of the second sub-transistor may include a first insulating layer. The gate insulating layer of the first sub-transistor may further include a second insulating layer.

The gate electrode of the first sub-transistor and the gate electrode of the second sub-transistor may be at a same layer.

The second sub-transistor may be between the first electrode of the first sub-transistor and the second electrode of the first transistor.

The gate electrode of the first sub-transistor may include a first length. The gate electrode of the second sub-transistor may include a second length greater than the first length.

The gate electrode of the first sub-transistor may include a first width. The gate electrode of the second sub-transistor may include a second width greater than the first width.

The first transistor may include a channel region including impurity ions, a first area, and a second area, the first area and the second area being located sequentially in a thickness direction. A concentration of the impurity ions in the channel region of the first transistor may have a highest point in the first area and a lowest point in the second area.

The concentration of the impurity ions may increase from the lowest point toward the highest point. The impurity ions may include fluorine.

The highest point of the concentration of the impurity ions may be located at a lower surface of the channel region of the first transistor.

The display device may further include a third transistor electrically connected to the first electrode of the first transistor, the third transistor being configured to transmit a data signal to the first transistor.

The display device may further include a light emitting element electrically connected to the second electrode of the first transistor, the light emitting element being configured to emit light according to the driving current.

According to an embodiment of the present disclosure, a display device includes a first transistor configured to control a driving current flowing from a first electrode to a second electrode according to a voltage applied to a gate electrode of the first transistor, and a second transistor between the second electrode of the first transistor and the gate electrode of the first transistor, the second transistor includes a first sub-transistor and a second sub-transistor. A same scan signal may be transmitted to a gate electrode of the first sub-transistor and a gate electrode of the second sub-transistor. The gate electrode of the first sub-transistor is formed of a first conductive layer. The gate electrode of the second sub-transistor is formed of a second conductive layer different from the first conductive layer.

A gate insulating layer of the first sub-transistor may include a first thickness. A gate insulating layer of the second sub-transistor may include a second thickness smaller than the first thickness.

The gate insulating layer of the first sub-transistor and the gate insulating layer of the second sub-transistor may include a first insulating layer. The gate insulating layer of the first sub-transistor may further include a second insulating layer.

The gate electrode of the first sub-transistor and the gate electrode of the second sub-transistor may be at different layers from each other.

According to an embodiment of the present disclosure, a display device includes a substrate, a semiconductor layer on the substrate, the semiconductor layer including a first channel region of a first sub-transistor and a second channel region of a second sub-transistor, a first insulating layer on the semiconductor layer, a gate electrode of the second sub-transistor on the first insulating layer, a second insulating layer on the gate electrode of the second sub-transistor and a gate electrode of the first sub-transistor on the second insulating layer. A same scan signal may be transmitted to the gate electrode of the first sub-transistor and the gate electrode of the second sub-transistor.

A thickness between the first channel region of the first sub-transistor and the gate electrode of the first sub-transistor may be greater than a thickness between the second channel region of the second sub-transistor and the gate electrode of the second sub-transistor.

The gate electrode of the first sub-transistor and the gate electrode of the second sub-transistor may be at different layers from each other.

The display device may further include a first transistor configured to control a driving current flowing from a first electrode to a second electrode according to a voltage applied to a gate electrode of the first transistor. The first sub-transistor may be between the second electrode of the first transistor and the gate electrode of the first transistor. The second sub-transistor may be between the first electrode of the first sub-transistor and the second electrode of the first transistor.

BRIEF DESCRIPTION OF THE DRAWINGS

These and/or other aspects will become apparent and more readily appreciated from the following description of embodiments, taken in conjunction with the accompanying drawings in which.

DETAILED DESCRIPTION

Figure 1:
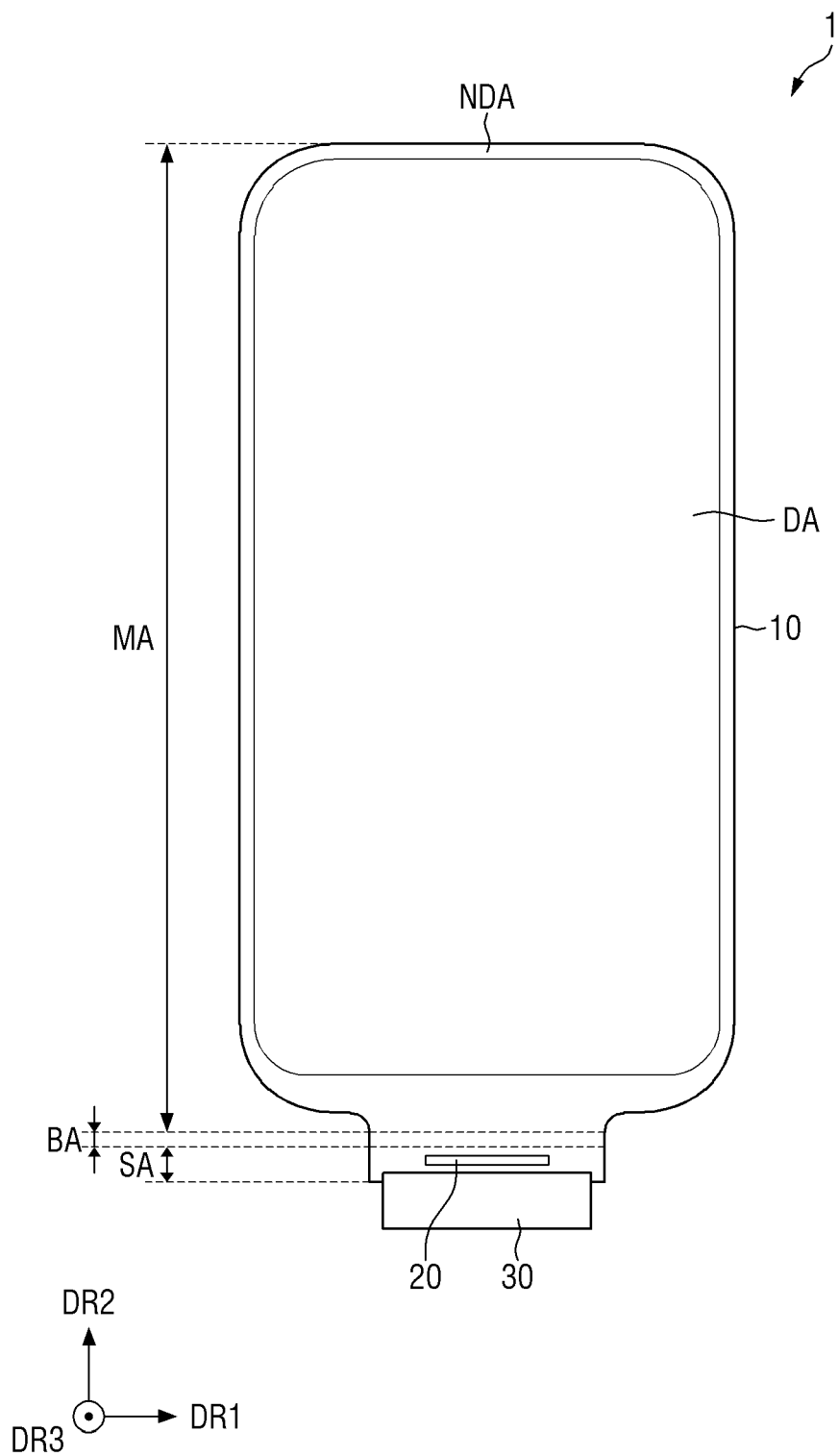
FIG. 1 is a plan view of a display device according to one or more embodiments.

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

The terminology used herein is for the purpose of describing particular example embodiments only and is not intended to limit the example embodiments described herein.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

It will also be understood that when an element (e.g., a layer or a substrate) is referred to as being "on" or "connected to" another element (e.g., a layer or a substrate), it may be directly on the other element (e.g., the layer or the substrate), or one or more intervening layers may also be present. When an element is referred to as being "directly on," "directly connected to," or "directly coupled to" another element, there are no intervening elements present. The same reference numbers indicate the same components throughout the specification. It will be understood that, although the terms "first," "second," etc. may be used herein to describe various elements, these elements should not be limited by these terms. These terms are only used to distinguish one element from another element. For instance, a first element discussed below may be referred to as a second element without departing from the teachings of the present disclosure. Similarly, the second element may be referred to as the first element without departing from the teachings of the present disclosure.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, specific embodiments will be described with reference to the attached drawings.

Figure 2:
FIG. 2 is a side view of the display device of FIG. 1.
Figure 2:
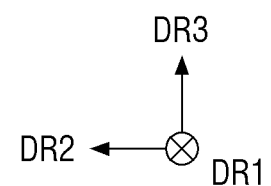

FIG. 1 is a plan view of a display device 1 according to one or more embodiments. FIG. 2 is a side view of the display device 1 of FIG. 1. FIG. 2 illustrates a side shape of the display device 1 bent in a thickness direction.

The display device 1 is a device for displaying moving images or still images. The display device 1 may be used as a display screen in portable electronic devices such as mobile phones, smartphones, tablet personal computers (PCs), smart watches, watch phones, mobile communication terminals, electronic notebooks, electronic books, portable multimedia players (PMPs), navigation devices and ultra-mobile PCs (UMPCs), as well as in various products such as televisions, notebook computers, monitors, billboards and the Internet of things (IoT).

The display device 1 according to one or more embodiments may be substantially rectangular in a plan view. The display device 1 may be shaped like a rectangle with right-angled corners in a plan view. However, the present disclosure is not limited thereto. For example, the display device 1 may be shaped like a rectangle with rounded corners in a plan view.

In the drawings, a first direction DR1 indicates a horizontal direction of the display device 1 in a plan view, and a second direction DR2 indicates a vertical direction of the display device 1 in a plan view. In addition, a third direction DR3 indicates the thickness direction of the display device 1. The first direction DR1 and the second direction DR2 perpendicularly intersect each other, and the third direction DR3 perpendicularly intersects both the first direction DR1 and the second direction DR2 in a direction intersecting a plane in which the first direction DR1 and the second direction DR2 lie. However, directions mentioned in embodiments should be understood as relative directions, and the embodiments are not limited to the mentioned directions.

Unless otherwise defined, the terms "upper," "upper surface" and "upper side" used herein based on the third direction DR3 refer to a display surface side of a display panel 10, and the terms "lower," "lower surface" and "lower side" refer to a side of the display panel 10 that is opposite to the display surface side.

Referring to FIGS. 1 and 2, the display device 1 may include the display panel 10. The display panel 10 may be a flexible substrate including a flexible polymer material such as polyimide. Accordingly, the display panel 10 can be curved, bent, folded, or rolled.

The display panel 10 may be an organic light emitting display panel. In the following embodiments, a case where an organic light emitting display panel is applied as the display panel 10 will be described as an example. However, the present disclosure is not limited to this example, and other types of display panels such as a liquid crystal display (LCD) panel, a quantum-dot organic light emitting display (QD-OLED) panel, a quantum-dot LCD (QD-LCD) panel, a quantum-nano light emitting display panel, and a micro light emitting diode (LED) display panel are also applicable.

The display panel 10 may include a display area DA where a screen is provided (i.e., an image is displayed) and a non-display area NDA where no screen is provided (i.e., no image is displayed). The display panel 10 may be divided into the display area DA and the non-display area NDA in a plan view. The non-display area NDA may be around (e.g., surround) the display area DA. The non-display area NDA may forma bezel.

The display area DA may be shaped like a rectangle with right-angled corners or a rectangle with rounded corners in a plan view. However, the present disclosure is not limited thereto. For example, the planar shape of the display area DA is not limited to a rectangle, and, in one or more embodiments, the planar shape of the display area may be a circle, an oval, or various other suitable shapes.

The display area DA may include a plurality of pixels. The pixels may be arranged in a matrix shape. Each of the pixels may include a light emitting layer and a circuit layer for controlling the amount of light emitted from the light emitting layer. The circuit layer may include a wiring, an electrode, and at least one transistor. The light emitting layer may include an organic light emitting material. The light emitting layer may be sealed by an encapsulation layer. The detailed configuration of each pixel will be described later.

The non-display area NDA may be around (e.g., surround) all sides of the display area DA and form edges of the display area DA. However, the present disclosure is not limited thereto. For example, the non-display area NDA may be around less than all of the sides of the display area DA.

The display panel 10 may include a main area MA and a bending area BA connected to a side of the main area MA in the second direction DR2. The display panel 10 may further include a sub-area SA connected to a side of the bending area BA in the second direction DR2 and bent in the thickness direction to overlap the main area MA in the thickness direction.

The display area DA may be located in the main area MA. The non-display area NDA may be located in or at an edge part around the display area DA of the main area MA.

The main area MA may have a shape similar to the planar shape of the display device 1. The main area MA may be a flat area located in one plane. However, the present disclosure is not limited thereto. For example, at least one of edges of the main area MA excluding an edge (or side) connected to the bending area BA may be curved or may be bent perpendicularly.

If at least one of the edges of the main area MA excluding the edge (or side) connected to the bending area BA is curved or bent, the display area DA may also be disposed at the curved or bent edge. However, the present disclosure is not limited thereto. For example, the non-display area NDA where no screen is provided (i.e., no image is displayed) or both the display area DA and the non-display area NDA may be disposed at the curved or bent edge.

The non-display area NDA of the main area MA may extend from an outer boundary of the display area DA to edges of the display panel 10. Signal wirings or driving circuits for transmitting signals to the display area DA may be disposed in the non-display area NDA of the main area MA.

The bending area BA may be connected to a short side of the main area MA. A width (e.g., a width in the first direction DR1) of the bending area BA may be smaller than a width (e.g., a width of the short side in the first direction DR1) of the main area MA. A connection part of the main area MA and the bending area BA may have an L-cut shape to reduce a width of a bezel.

In the bending area BA, the display panel 10 may be bent with a curvature in a direction opposite to a display surface. As the display panel 10 is bent in the bending area BA, a direction that a surface of the display panel 10 faces may be reversed. That is, a surface of the display panel 10 which faces upward may be changed to face outward laterally through the bending area BA and then to face downward.

The sub-area SA extends from the bending area BA. The sub-area SA may start after bending is completed and may extend parallel to the main area MA. The sub-area SA may be overlapped by the main area MA in the thickness direction of the display panel 10. The sub-area SA may be overlapped by the non-display area NDA at an edge of the main area MA and may be further overlapped by the display area DA of the main area MA. A width of the sub-area SA may be, but is not necessarily, equal to the width of the bending area BA.

A pad part may be disposed on the sub-area SA of the display panel 10. An external device may be mounted (or attached) on the pad part. Examples of the external device include a driving chip 20 and a driving board 30 made of a flexible printed circuit board or a rigid printed circuit board. In addition, a wiring connection film, a connector, etc. may be mounted on the pad part as external devices. Only one external device or a plurality of external devices may be mounted on the sub-area SA. For example, as illustrated in FIGS. 1 and 2, the driving chip 20 may be disposed on the sub-area SA of the display panel 10, and the driving board 30 may be attached to an end of the sub-area SA. In this case, the display panel 10 may include both a pad part connected to the driving chip 20 and a pad part connected to the driving board 30. In one or more embodiments, a driving chip may be mounted on a film, and the film may be attached to the sub-area SA of the display panel 10.

The driving chip 20 may be mounted on a surface of the display panel 10 which is the same surface as the display surface. As the direction that the surface of the display panel 10 faces is reversed by the bending of the bending area BA as described above, an upper surface of the driving chip 20 mounted on the surface of the display panel 10 facing downward in the thickness direction may also face downward in the thickness direction.

The driving chip 20 may be attached onto the display panel 10 through an anisotropic conductive film or may be attached onto the display panel 10 through ultrasonic bonding. The driving chip 20 may include an integrated circuit for driving the display panel 10.

Figure 3:
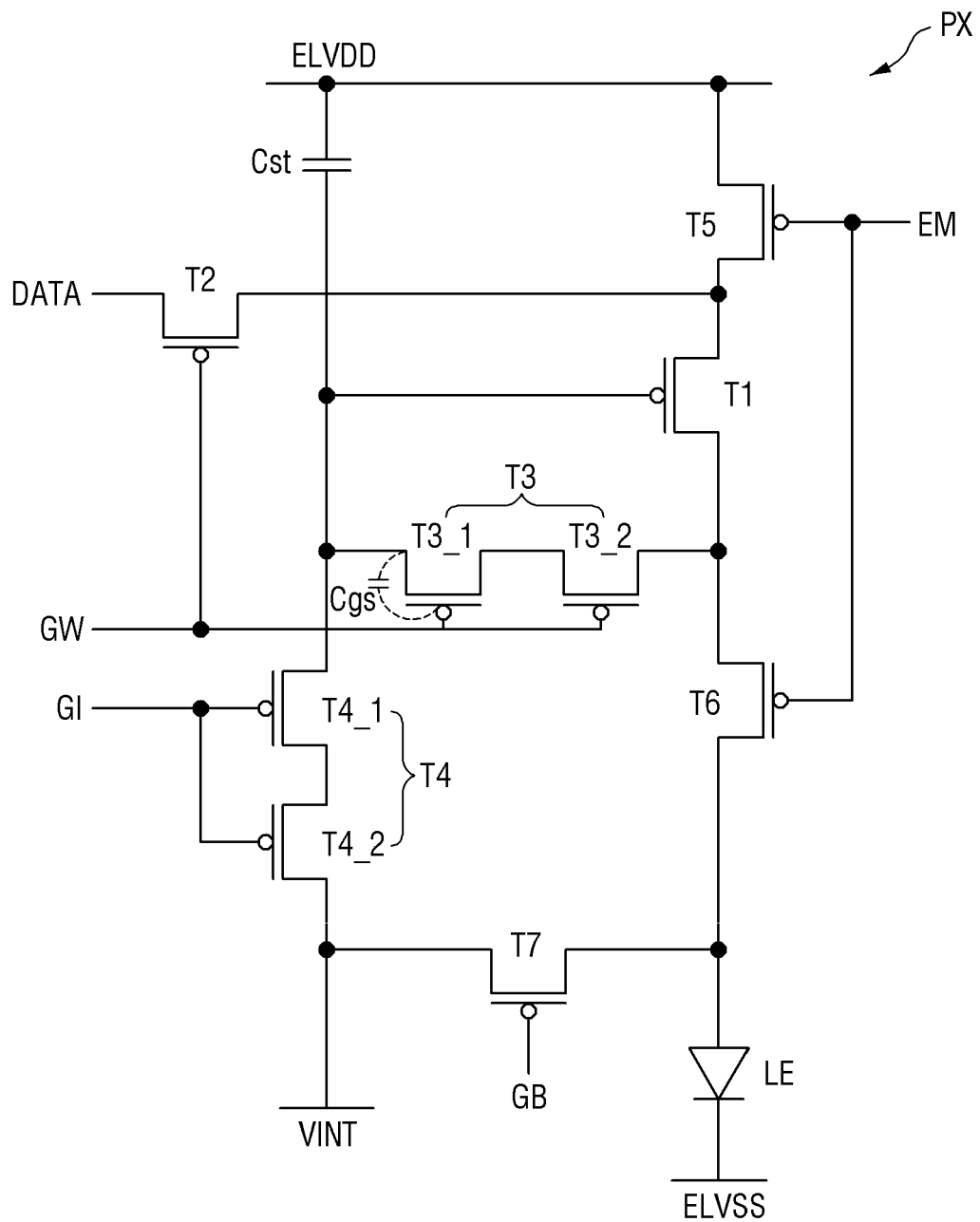
FIG. 3 is a detailed circuit diagram of a pixel according to one or more embodiments.

FIG. 3 is a detailed circuit diagram of a pixel PX according to one or more embodiments.

Referring to FIG. 3, the circuit of the pixel PX includes a plurality of transistors (e.g., a first transistor T1, a second transistor T2, a third transistor, T3, a fourth transistor T4, a fifth transistor T5, a sixth transistor T6, and a seventh transistor T7), a capacitor Cst, and a light emitting element LE. A data signal DATA, a first scan signal GW, a second scan signal GI, a third scan signal GB, an emission control signal EM, a first power voltage ELVDD, a second power voltage ELVSS, and an initialization voltage VINT are applied to the circuit of one pixel PX.

Figure 5:
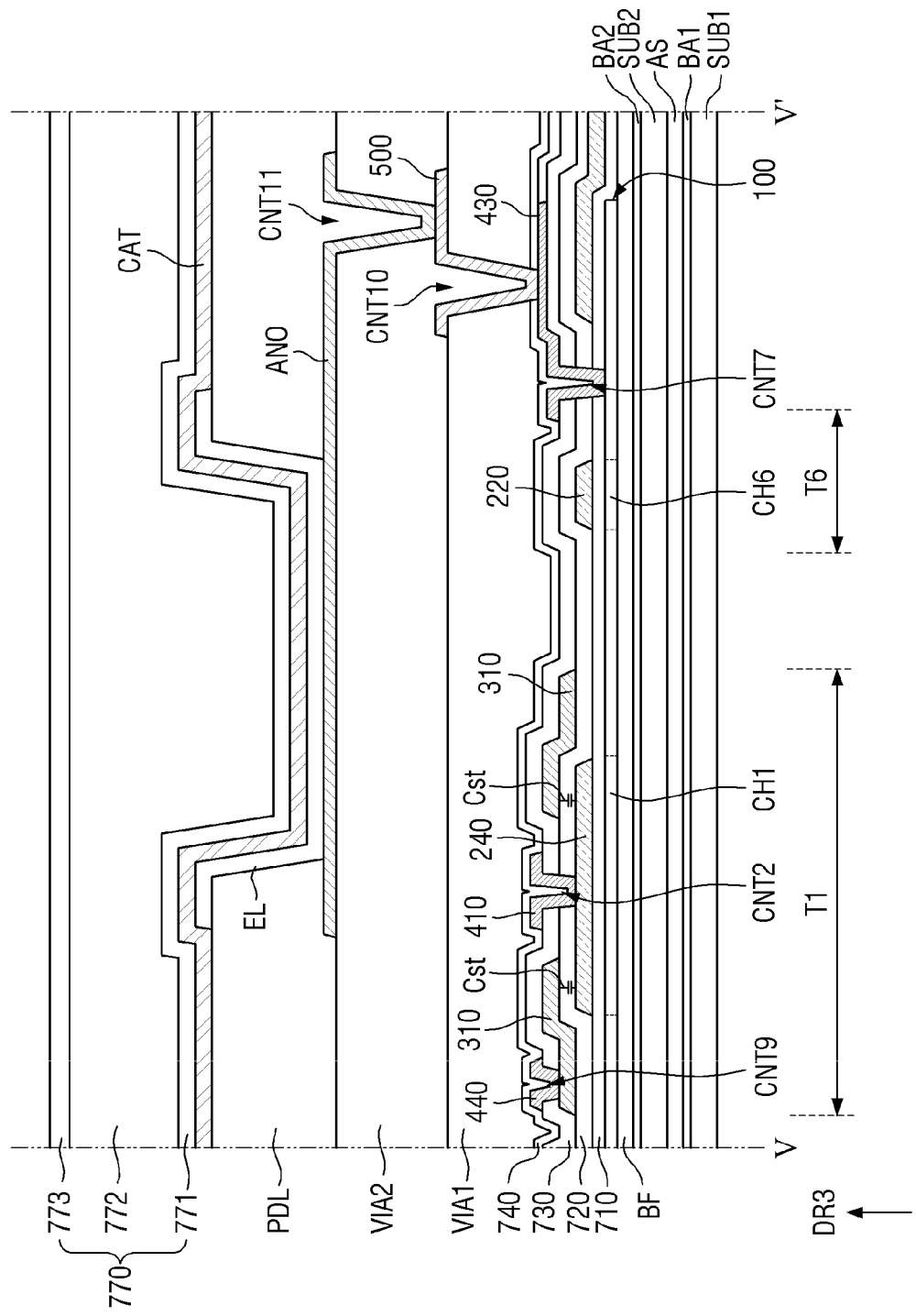
FIG. 5 is a cross-sectional view taken along the line V-V' of FIG. 4.

The light emitting element LE may be, but is not limited to, an organic light emitting diode including a first electrode (e.g., an anode ANO as shown in FIG. 5), a light emitting layer EL (e.g., see FIG. 5), and a second electrode (e.g., a cathode CAT as shown in FIG. 5).

The transistors may include first through seventh transistors T1 through T7. Each of the transistors T1 through T7 includes a gate electrode, a first electrode (e.g., a first source electrode or a first drain electrode), and a second electrode (e.g., a second source electrode a second drain electrode). Any one of the first electrode and the second electrode of each of the transistors T1 through T7 may be a source electrode, and the other one may be a drain electrode. In one or more embodiments, the first transistor T1 may serve as a driving transistor, and the second through seventh transistors T2 through T7 may serve as switching transistors.

Each of the transistors T1 through T7 may be a thin-film transistor. Each of the transistors T1 through T7 may be any one of a p-channel metal oxide semiconductor (PMOS) transistor and an n-channel metal oxide semiconductor (NMOS) transistor. In one or more embodiments, the first transistor T1 (e.g., a driving transistor), the second transistor T2 (e.g., a data transfer transistor), the third transistor T3 (e.g., a compensation transistor), the fourth transistor T4 (e.g., a first initialization transistor), the fifth transistor T5 (e.g., a first emission control transistor), the sixth transistor T6 (e.g., a second emission control transistor), and the seventh transistor T7 (e.g., a second initialization transistor) are all PMOS transistors.

However, the present disclosure is not limited thereto. For example, the third transistor T3 (e.g., the compensation transistor) and the fourth transistor T4 (e.g., the first initialization transistor) may be NMOS transistors, and the first transistor T1 (e.g., the driving transistor), the second transistor T2 (e.g., the data transfer transistor), the fifth transistor T5 (e.g., the first emission control transistor), the sixth transistor T6 (e.g., the second emission control transistor), and the seventh transistor T7 (e.g., the second initialization transistor) may be PMOS transistors.

In this case, active layers of the third transistor T3 and the fourth transistor T4 may include a different material from active layers of the first transistor T1, the second transistor T2, the fifth transistor T5, the sixth transistor T6 and the seventh transistor T7. For example, the active layers of the third transistor T3 and the fourth transistor T4 may include an oxide semiconductor, and the active layers of the first transistor T1, the second transistor T2, the fifth transistor T5, the sixth transistor T6 and the seventh transistor T7 may include polycrystalline silicon. However, the present disclosure is not limited thereto.

Each element (e.g., transistors T1 through T7) will now be described in more detail.

The gate electrode of the first transistor T1 is connected to a first electrode of the capacitor Cst. The first electrode of the first transistor T1 is connected to a first power voltage (ELVDD) line via the fifth transistor T5. The second electrode of the first transistor T1 is connected to the anode of the light emitting element LE via the sixth transistor T6. The first transistor T1 may receive the data signal DATA according to a switching operation of the second transistor T2 and may supply a driving current to the light emitting element LE.

The gate electrode of the second transistor T2 is connected to a first scan signal (GW) line. The first electrode of the second transistor T2 is connected to a data signal (DATA) line. The second electrode of the second transistor T2 is connected to the first electrode of the first transistor T1 and is connected to the first power voltage (ELVDD) line via the fifth transistor T5. The second transistor T2 may be turned on according to the first scan signal GW and may perform a switching operation to transfer the data signal DATA to the first electrode of the first transistor T1.

The third transistor T3 may be formed as a dual transistor including a first sub-transistor T3_1 and a second sub-transistor T3_2. The first sub-transistor T3_1 has a gate electrode connected to the first scan signal (GW) line, a first electrode connected to a second electrode of the second sub-transistor T3_2, and a second electrode connected to the first electrode of the capacitor Cst, a first electrode of a third sub-transistor T4_1, and the gate electrode of the first transistor T1. The second sub-transistor T3_2 has a gate electrode connected to the first scan signal (GW) line, a first electrode connected to the second electrode of the first transistor T1, and the second electrode connected to the first electrode of the first sub-transistor T3_1.

The first sub-transistor T3_1 and the second sub-transistor T3_2 may be turned on by the first scan signal GW and may connect the gate electrode and the second electrode of the first transistor T1 to diode-connect the first transistor T1. Accordingly, a voltage difference corresponding to a threshold voltage of the first transistor T1 may be generated between the first electrode and the gate electrode of the first transistor T1, and the data signal DATA compensated for the threshold voltage may be supplied to the gate electrode of the first transistor T1 to compensate for a threshold voltage deviation of the first transistor T1.

The pixel PX may further include a parasitic capacitor Cgs. The parasitic capacitor Cgs may be located between the gate electrode and the second electrode of the first sub-transistor T3_1. The parasitic capacitor Cgs may apply the effect of a kickback voltage to the gate electrode of the first transistor T1. Accordingly, a voltage of a desired or suitable magnitude may not be applied to the gate electrode of the first transistor T1. However, a thickness of a gate insulating layer of the first sub-transistor T3_1 may be greater than a thickness of a gate insulating layer of the second sub-transistor T3_2. In this case, the size of the parasitic capacitor Cgs may be reduced, a kickback phenomenon may be suppressed or prevented, and a medium/long-term image sticking figure of merit (ISFOM) may be improved. This will be described in more detail later.

The fourth transistor T4 may be formed as a dual transistor including the third sub-transistor T4_1 and a fourth sub-transistor T4_2. The third sub-transistor T4_1 may have a gate electrode connected to a second scan signal (GI) line, the first electrode connected to the first electrode of the capacitor Cst, the second electrode of the first sub-transistor T3_1 and the gate electrode of the first transistor T1, and a second electrode connected to a first electrode of the fourth sub-transistor T4_2. The fourth sub-transistor T4_2 may have a gate electrode connected to the second scan signal (GI) line, the first electrode connected to the second electrode of the third sub-transistor T4_1, and a second electrode connected to the initialization voltage VINT. The third sub-transistor T4_1 and the fourth sub-transistor T4_2 may be turned on by the second scan signal GI and may transfer the initialization voltage VINT to the gate electrode of the first transistor T1, thereby initializing the voltage of the gate electrode of the first transistor T1.

The fifth transistor T5 has the gate electrode connected to an emission control signal (EM) line, the first electrode connected to the first power voltage line ELVDD, and the second electrode connected to the first electrode of the first transistor T1. The fifth transistor T5 may be turned on by the emission control signal EM to connect the first electrode of the first transistor T1 and the first power voltage line ELVDD.

The sixth transistor T6 is connected between the second electrode of the first transistor T1 and the first electrode of the light emitting element LE. The sixth transistor T6 has the gate electrode connected to the emission control signal (EM) line, the first electrode connected to the second electrode of the first transistor T1 and the first electrode of the second sub-transistor T3_2, and the second electrode connected to the first electrode of the light emitting element LE.

The fifth transistor T5 and the sixth transistor T6 may be concurrently (e.g., simultaneously) turned on according to the emission control signal EM. Accordingly, a driving current may flow through the light emitting element LE.

The gate electrode of the seventh transistor T7 is connected to a third scan signal (GB) line. The first electrode of the seventh transistor T7 is connected to the anode of the light emitting element LE. The second electrode of the seventh transistor T7 is connected to an initialization voltage (VINT) line. The seventh transistor T7 may be turned on according to the third scan signal GB to initialize the anode of the organic light emitting element LE.

In the current embodiment, the gate electrode of the seventh transistor T7 may receive the third scan signal GB. However, in another embodiment, the circuit of the pixel PX may be configured such that the gate electrode of the seventh transistor T7 receives the emission control signal EM or the second scan signal GI.

The capacitor Cst is formed between the gate electrode of the first transistor T1 and the first power voltage line ELVDD and includes the first electrode and a second electrode. The first electrode of the capacitor Cst may be connected to the gate electrode of the first transistor T1, the second electrode of the third transistor T3 and the first electrode of the fourth transistor T4, and the second electrode of the capacitor Cst may be connected to the first power voltage line ELVDD. The capacitor Cst may keep a data voltage applied to the gate electrode of the first transistor T1 constant.

The cathode of the light emitting element LE is connected to a second power voltage (ELVSS) line. The light emitting element LE emits light by receiving a driving current from the first transistor T1, thereby displaying an image.

The planar layout and cross-sectional structure of the above-described pixel PX will now be described in more detail.

Figure 4:
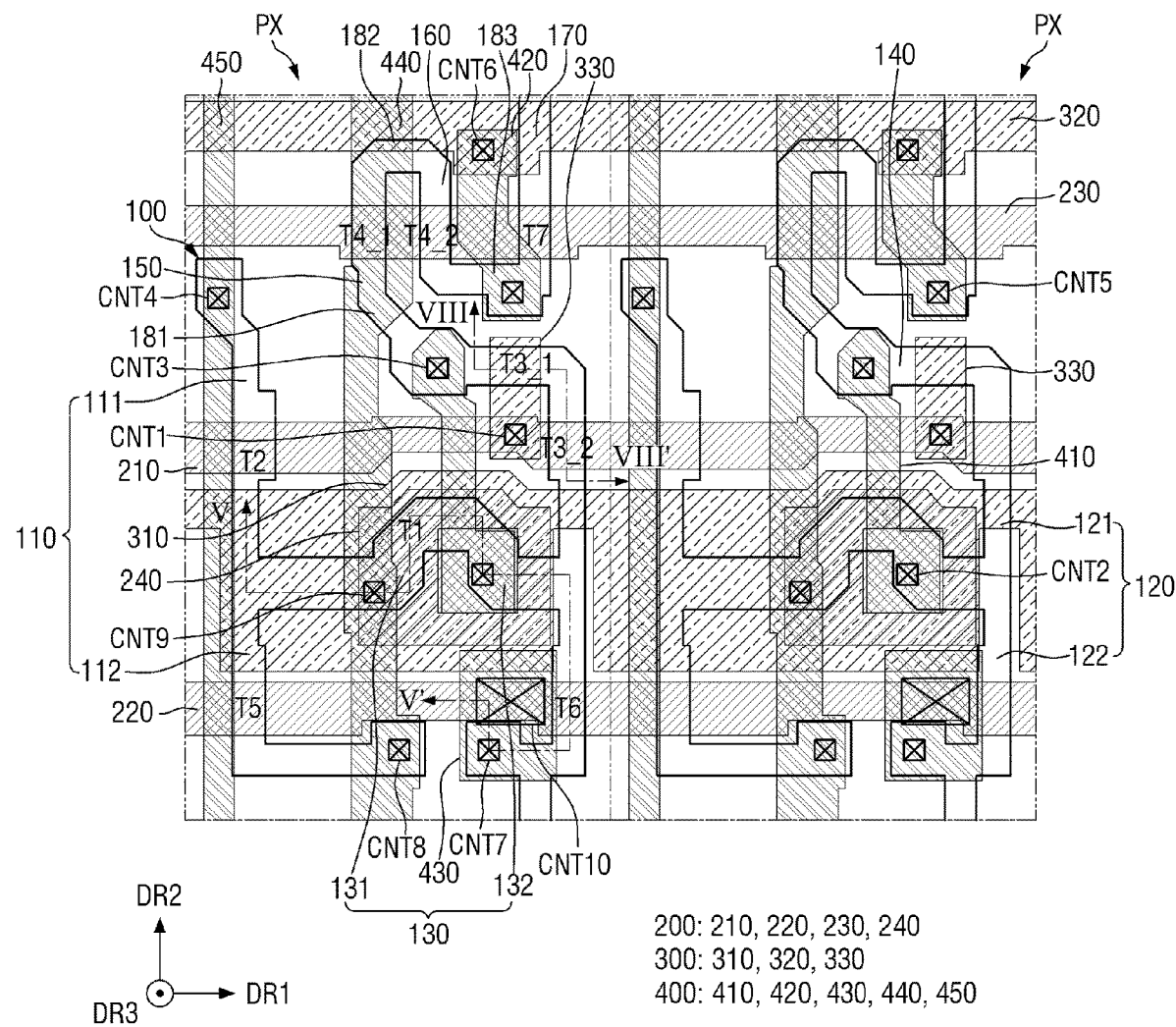
FIG. 4 is a layout view of pixels of the display device according to one or more embodiments.

FIG. 4 is a layout view of pixels PX of the display device 1 according to one or more embodiments. FIG. 5 is a cross-sectional view taken along the line V-V' of FIG. 4. FIG. 4 illustrates a layout view of two pixels PX adjacent to each other. FIG. 5 further illustrates the anode ANO, the light emitting layer EL, the cathode CAT, and a thin-film encapsulation layer 770 in the layout view of FIG. 4.

Referring to FIGS. 4 and 5, as described above, each pixel PX includes the transistors T1 through T7, the capacitor Cst (e.g., see FIG. 3), and the light emitting element LE (e.g., see FIG. 3).

The capacitor Cst includes conductive layers forming electrodes and an insulating layer disposed between the conductive layers. An organic light emitting diode OLED includes conductive layers forming an anode and a cathode and an organic light emitting layer disposed between the conductive layers. The electrical connection of each element may be achieved by a wiring made of a conductive layer and/or a via made of a conductive material. The above-described conductive material, conductive layer, semiconductor layer, insulating layer, light emitting layer, etc. are disposed on a first substrate SUB1 and/or a second substrate SUB2.

Each layer of a pixel PX may be disposed in the order of the first substrate SUB1, a first barrier layer BA1, a lower semiconductor layer AS, the second substrate SUB2, a second barrier layer BA2, a buffer layer BF, a semiconductor layer 100, a first insulating layer 710, a first conductive layer 200, a second insulating layer 720, a second conductive layer 300, a third insulating layer 730, a third conductive layer 400, a protective layer 740, a first via layer VIA1, a second anode connection electrode 500, a second via layer VIA2, the anode ANO, a pixel defining layer PDL, the light emitting layer EL, and the cathode CAT. Each of the above layers may be a single layer or a stacked layer including a plurality of layers. Another layer may also be further disposed between the above layers.

The first substrate SUB1 supports each layer disposed thereon. When an organic light emitting display device is of a bottom emission type or a double-sided emission type, a transparent substrate may be used. When the organic light emitting display device is of a top emission type, not only a transparent substrate but also a translucent or opaque substrate may be applied.

The first substrate SUB1 may be made of an insulating material such as glass, quartz, or polymer resin. The polymer material may be, for example, polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination of the same. The first substrate SUB1 may also include a metal material.

The first substrate SUB1 may be a rigid substrate or a flexible substrate that can be bent, folded, or rolled. The material that forms the flexible substrate may be, but is not limited to, polyimide (PI).

The first barrier layer BA1 may be disposed on the first substrate SUB1. The first barrier layer BA1 may be disposed over an area (e.g., an entire area) of the first substrate SUB1. The first barrier layer BA1 may prevent or reduce diffusion of impurity ions, prevent or reduce penetration of moisture or outside air, and perform a surface planarization function. The first barrier layer BA1 may include silicon oxide ($SiO_x$). However, the present disclosure is not limited thereto. For example, the first barrier layer BA1 may also include silicon nitride ($SiN_x$) or silicon oxynitride ($SiO_xN_y$). The first barrier layer BA1 can be omitted depending on the type or processing conditions of the first substrate SUB1.

The lower semiconductor layer AS may be disposed on the first barrier layer BA1. The lower semiconductor layer AS may be disposed between the first substrate SUB1 and the second substrate SUB2. The lower semiconductor layer AS may include amorphous silicon. However, the present disclosure is not limited thereto. For example, the lower semiconductor layer AS may include at least one of polycrystalline silicon and oxide silicon. The lower semiconductor layer AS may enable elements stacked on and/or under the lower semiconductor layer AS to be bonded more securely. For example, the presence of the lower semiconductor layer AS may enable the first substrate SUB1 and the second substrate SUB2 disposed on and under the lower semiconductor layer AS to be bonded more securely.

The second substrate SUB2 may be disposed on the lower semiconductor layer AS. The description of the first substrate SUB1 may also apply to the second substrate SUB2. Therefore, a redundant description of the second substrate SUB2 may not be repeated.

The second barrier layer BA2 may be disposed on the second substrate SUB2. The description of the first barrier layer BA1 may also apply to the second barrier layer BA2. Therefore, a redundant description of the second barrier layer BA2 may not be repeated.

The buffer layer BF may be disposed on the second barrier layer BA2. The buffer layer BF may be disposed on a surface (e.g., an entire surface) of the second barrier layer BA2. The buffer layer BF may prevent or reduce diffusion of impurity ions, prevent or reduce penetration of moisture or outside air, and perform a surface planarization function. The buffer layer BF may include silicon nitride. However, the present disclosure is not limited thereto. For example, the buffer layer BF may include silicon oxide or silicon oxynitride. The buffer layer BF can be omitted depending on the type or processing conditions of the second substrate SUB2.

The semiconductor layer 100 may be disposed on the buffer layer BF. The semiconductor layer 100 is an active layer that forms a first area, a second area, and a channel (or a channel region) contacting the first electrode and the second electrode of each of the first through seventh transistors T1 through T7. Any one of the first area and the second area is a source area, and the other one is a drain area.

Hereinafter, in reference to one or more embodiments, a right side in a plan view will be referred to as a first side of the first direction DR1, a left side in a plan view will be referred to as a second side of the first direction DR1, an upper side in a plan view will be referred to as a first side of the second direction DR2, and a lower side in a plan view will be referred to as a second side of the second direction DR2.

The semiconductor layer 100 may be connected without being separated for each pixel PX. The semiconductor layer 100 may have a specific pattern in a plan view. For example, the semiconductor layer 100 may include a first vertical part 110, a second vertical part 120, a third vertical part 150, a fourth vertical part 160 and a fifth vertical part 170 which generally extend in the second direction DR2, a first horizontal part 130 and a second horizontal part 140 which generally extend in the first direction DR1, and first through third connection parts 181 through 183 (i.e., a first connection part 181, a second connection part 182, and a third connection part 183) which connect some of the vertical parts 110, 120, 150, 160 and 170 and the horizontal parts 130 and 140. The vertical parts 110, 120, 150, 160 and 170, the horizontal parts 130 and 140, and the first through third connection parts 181 through 183 may be connected (e.g., physically connected) to each other.

The first vertical part 110 may be disposed adjacent to a second side of a pixel PX in the first direction DR1, and the second vertical part 120 may be disposed adjacent to a first side of the pixel PX in the first direction DR1. The first vertical part 110 and the second vertical part 120 may be spaced from each other. The first vertical part 110 may be longer than the second vertical part 120 in the second direction DR2. The first horizontal part 130 may connect middle parts of the first vertical part 110 and the second vertical part 120. For example, a middle part of the first vertical part 110 may be between an upper part 111 of the first vertical part 110 and a lower part 112 of the first vertical part 110. As another example, a middle part of the second vertical part 120 may be between an upper part 121 of the second vertical part 120 and a lower part 122 of the second vertical part 120. In the specification, "upper parts 111 and 121" of the first vertical part 110 and the second vertical part 120 may refer to parts located closer to the first side of the second direction DR2 than the parts connected to the first horizontal part 130 are to the first side of the second direction DR2 in a plan view, and "lower parts 112 and 122" may refer to parts located closer to the second side of the second direction DR2 than the parts connected to the first horizontal part 130 are to the second side of the second direction DR2 in a plan view. A shape formed by the first vertical part 110, the second vertical part 120, and the first horizontal part 130 in a plan view may be roughly similar to an 'H' shape.

In one or more embodiments, the first horizontal part 130 may connect the first vertical part 110 and the second vertical part 120 with a shortest distance. However, as illustrated in the drawings, the first horizontal part 130 may also include a first bent part 131 on the second side of the first direction DR1 and a second bent part 132 on the first side of the first direction DR1. The total length of the first horizontal part 130 may be increased through bending multiple times.

The second horizontal part 140 may extend from an end of the upper part 121 of the second vertical part 120 on the first side of the second direction DR2 to the second side of the first direction DR1 and may be disposed closer to the first side of the second direction DR2 than the first horizontal part 130 is to the first side of the second direction DR2. An area of the second horizontal part 140 on the second side of the first direction DR1 may have a greater width in the second direction DR2 than a width of other areas (e.g., other areas of the second horizontal part 140) in the second direction DR2, but the present disclosure is not limited thereto.

The third vertical part 150, the fourth vertical part 160, and the fifth vertical part 170 may be disposed on a first side of the second horizontal part 140 in the second direction DR2. The third vertical part 150 may be disposed on a second side of the fifth vertical part 170 in the first direction DR1, and the fourth vertical part 160 may be disposed between the third vertical part 150 and the fifth vertical part 170. An end of the fifth vertical part 170 on the second side of the second direction DR2 may be connected to the fourth vertical part 160, but an end of the fifth vertical part 170 on the first side of the second direction DR2 may be connected to the lower part 122 of the second vertical part 120 of another adjacent pixel PX.

The first connection part 181 may be disposed between an end of the second horizontal part 140 on the second side of the first direction DR1 and an end of the third vertical part 150 on the second side of the second direction DR2. The first connection part 181 may connect the second horizontal part 140 and the third vertical part 150 and may be inclined to the first direction DR1 and the second direction DR2.

The second connection part 182 may be disposed between an end of the third vertical part 150 on the first side of the second direction DR2 and an end of the fourth vertical part 160 on the first side of the second direction DR2. The second connection part 182 may connect the third vertical part 150 and the fourth vertical part 160.

The third connection part 183 may be disposed between an end of the fourth vertical part 160 on the second side of the second direction DR2 and the end of the fifth vertical part 170 on the second side of the second direction DR2. The third connection part 183 may connect the fourth vertical part 160 and the fifth vertical part 170.

A shape formed by the third vertical part 150, the fourth vertical part 160, the fifth vertical part 170, the second connection part 182, and the third connection part 183 in a plan view may be roughly similar to an inverted and lying 'S' shape.

A channel of the second transistor T2 may be disposed in the upper part 111 of the first vertical part 110, and a channel of the fifth transistor T5 may be disposed in the lower part 112 of the first vertical part 110. A channel CH3_2 (e.g., see FIG. 8) of the second sub-transistor T3_2 may be disposed in the upper part 121 of the second vertical part 120. A channel CH6 of the sixth transistor T6 may be disposed in the lower part 122 of the second vertical part 120. A channel CH1 of the first transistor T1 may be disposed in the first horizontal part 130. A channel CH3_1 (e.g., see FIG. 8) of the first sub-transistor T3_1 may be disposed in the second horizontal part 140. A channel of the third sub-transistor T4_1 may be disposed in the third vertical part 150, and a channel of the fourth sub-transistor T4_2 may be disposed in the fourth vertical part 160. A channel of the seventh transistor T7 may be disposed in the fifth vertical part 170.

The semiconductor layer 100 may include polycrystalline silicon. The polycrystalline silicon may be formed by crystalizing amorphous silicon. Examples of the crystallization method may include, but are not limited to, a rapid thermal annealing (RTA) method, a solid phase crystallization (SPC) method, an excimer laser annealing (ELA) method, a metal induced crystallization (MIC) method, a metal induced lateral crystallization (MILC) method, and/or a sequential lateral solidification (SLS) method. Alternatively, the semiconductor layer 100 may include monocrystalline silicon, low-temperature polycrystalline silicon and/or amorphous silicon, or may include an oxide semiconductor.

The semiconductor layer 100 may include impurity ions. The impurity ions may be p-type impurity ions. The intensity of the impurity ions may increase toward a lower part of the semiconductor layer 100. Specifically, in the semiconductor layer 100, a channel region of each of the transistors T1 through T7 may include not only channel doping ions but also the impurity ions. In this case, even if the second substrate SUB2 is polarized by the impurity ions disposed in the lower part of the semiconductor layer 100, the effect on characteristics of the first transistor T1 can be reduced, and further, the medium/long-term ISFOM can be improved. The impurity ions may include, for example, fluorine (F). The impurity ions will be described below as fluorine, but the present disclosure is not limited thereto.

Figure 6:
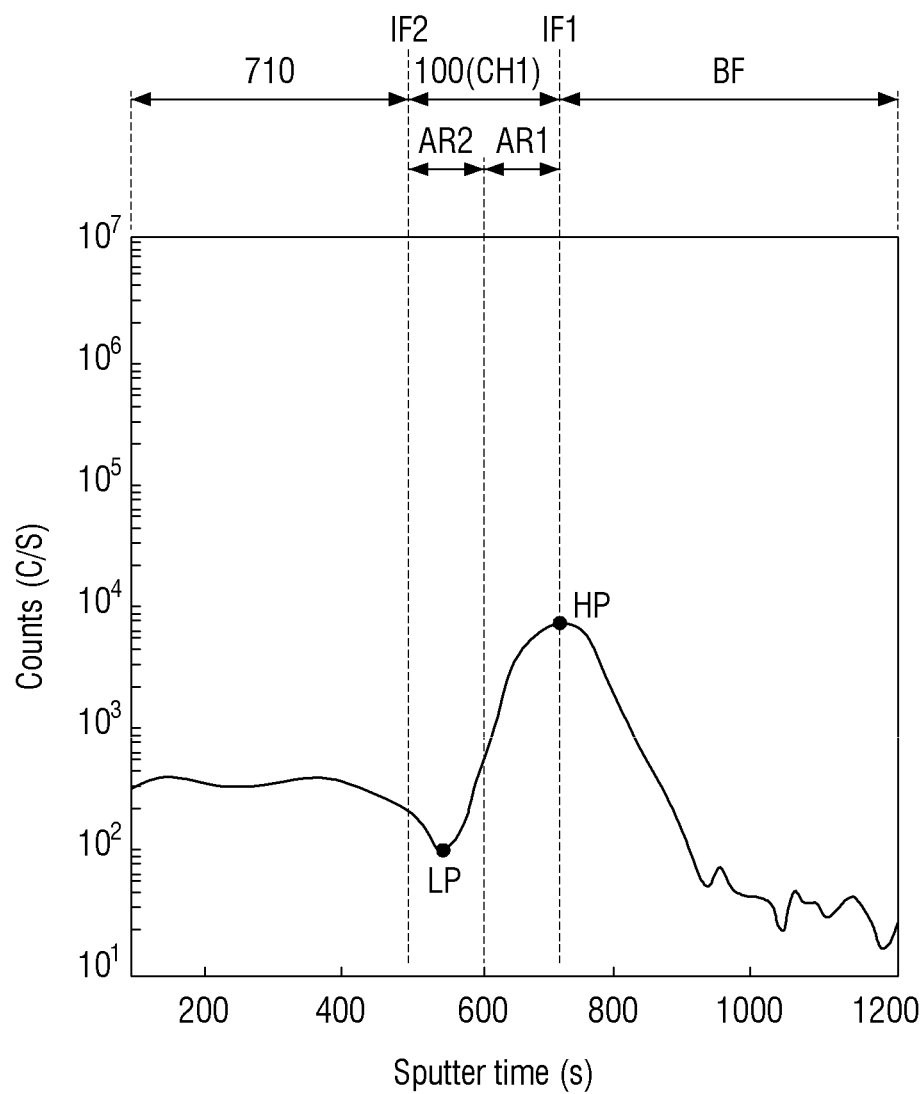
FIG. 6 is a graph illustrating fluorine distribution around a semiconductor layer according to one or more embodiments.

FIG. 6 is a graph illustrating fluorine distribution around a semiconductor layer according to one or more embodiments.

FIG. 6 illustrates the channel CH1 of the first transistor T1 as an example and illustrates fluorine intensities of the buffer layer BF and the first insulating layer 710 respectively disposed on and under the channel CH1 of the first transistor T1 as well as the channel CH1 of the first transistor T1. In FIG. 6, the horizontal axis (X axis) represents sputter time (s (seconds)), and the vertical axis (Y axis) represents fluorine intensity (C/S (counts per second)). FIG. 6 shows results measured using secondary ion mass spectrometry (SIMS).

Referring further to FIG. 6, the intensity of fluorine in the semiconductor layer 100 may increase toward the buffer layer BF. In other words, the semiconductor layer 100 extending from a first interface IF1 with the buffer layer BF to a second interface IF2 with the first insulating layer 710 may be divided into two equal areas (or regions) in the thickness direction (e.g., the third direction DR3). The two areas (or regions) into which the semiconductor layer 100 is divided are referred to as a first area (or first region) AR1 adjacent to the buffer layer BF and a second area (or second region) AR2 adjacent to the first insulating layer 710. In one or more embodiments, the first area AR1 of the semiconductor layer 100 may be between (e.g., between in the thickness direction) the second area AR2 and the first interface IF1, and the second area AR2 of the semiconductor layer 100 may be between (e.g., between in the thickness direction) the first area AR1 and the second interface IF2.

A first point HP (e.g., a highest point) at which the fluorine intensity in the semiconductor layer 100 is the highest may be located in the first area AR1. The first point HP is located on or at the first interface IF1, although the present disclosure is not limited thereto. In other words, the first point HP may be located on or at the other surface (e.g., a lower surface) of the semiconductor layer 100. In addition, a second point LP (e.g., a lowest point) at which the fluorine intensity in the semiconductor layer 100 is the lowest is located in the second area AR2. The fluorine intensity in the semiconductor layer 100 may increase from the second point LP toward the first point HP.

In the first area AR1, the fluorine intensity in the semiconductor layer 100 decreases from the first interface IF1 toward the second interface IF2. In the second area AR2, the fluorine intensity in the semiconductor layer 100 decreases from the first interface IF1 toward the second interface IF2 and then increases. An average value of the fluorine intensity of the first area AR1 may be greater than an average value of the fluorine intensity of the second area AR2.

In the semiconductor layer 100, a silicon (Si)-hydrogen (H) bond or a dangling bond exists on or at the first interface IF1 or the second interface IF2. Because the Si—H bond is a weak bond, it may be easily broken to form the dangling bond. When fluorine is injected into the semiconductor layer 100, the injected fluorine may tend to move to the first interface IF1 or the second interface IF2 where a lot of dangling bonds exist. Accordingly, the intensity of fluorine on the first interface IF1 or the second interface IF2 may be improved or increased. In addition, when fluorine is injected into the semiconductor layer 100 with energy of a certain magnitude or more, the fluorine may be concentrated on or at the first interface IF1 of the semiconductor layer 100. For example, the energy used to inject fluorine into the semiconductor layer 100 may be in the range of 13 KeV to 25 KeV or 15 KeV to 20 KeV or may be 15 KeV, but the present disclosure is not limited thereto.

When fluorine is concentrated on or at the first interface IF1 of the channel CH1 of the first transistor T1, a change in the characteristics of the first transistor T1 can be suppressed or prevented despite the polarization of the second substrate SUB2. In other words, even if the polarization of the second substrate SUB2 occurs, electrons can be suppressed or prevented from being charged in a back-channel of a channel region 101c of the first transistor T1 by the fluorine concentrated on or at the first interface IF1 of the channel CH1 of the first transistor T1. Further, defects such as medium afterimages and/or long-term afterimages that may occur due to the electrons charged in the back-channel can be suppressed or controlled.

Figure 7:
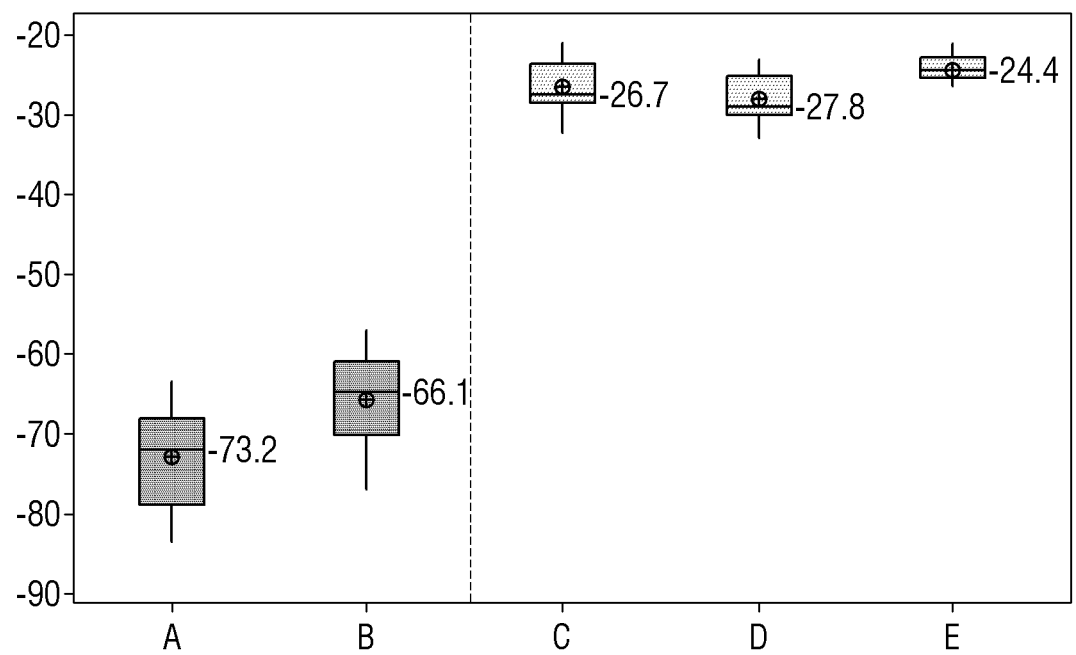
FIG. 7 is a graph evaluating an afterimage of a display device according to whether a semiconductor layer is doped with fluorine.

FIG. 7 is a graph evaluating an afterimage of a display device according to whether a semiconductor layer is doped with fluorine.

In FIG. 7, the horizontal axis represents Comparative Examples A and B and Examples C, D and E, and the vertical axis represents an afterimage level. In FIG. 7, it can be understood that the closer to '0', the better the afterimage characteristics. In FIG. 7, graphs A and B are cases where the semiconductor layer is not doped with fluorine, and graphs C, D and E are cases where the semiconductor layer is doped with fluorine, like the semiconductor layer 100 according to one or more embodiments.

In FIG. 7, an afterimage is evaluated as follows. First, an image is displayed in a color of 31G (grey). Then, an image in which a black image and a white image are arranged in a grid pattern is displayed for a set time (e.g., a predetermined time). Then, an image is displayed again in the color of 31G (grey). In this case, an afterimage of the grid pattern is evaluated.

Referring to FIG. 7, an average afterimage level of graph A is −73.2, and an average afterimage level of graph B is −66.1. An average afterimage level of graph C is −26.7, an average afterimage level of graph D is −27.8, and an average afterimage level of graph E is −24.4. That is, when a semiconductor layer is doped with fluorine, like the semiconductor layer 100 according to one or more embodiments, the medium/long-term ISFOM can be improved, and further, display quality can be improved.

Referring again to FIGS. 4 and 5, the first insulating layer 710 may be disposed on the semiconductor layer 100 and may be generally disposed over a surface (e.g., an entire surface) of the first substrate SUB1 and the second substrate SUB2. The first insulating layer 710 may be a gate insulating layer having a gate insulating function.

The first insulating layer 710 may include a silicon compound, a metal oxide, or the like. For example, the first insulating layer 710 may include silicon oxide, silicon nitride, silicon oxynitride, aluminum oxide, tantalum oxide, hafnium oxide, zirconium oxide, or titanium oxide. These materials may be used alone or in combination with each other.

The first conductive layer 200 is disposed on the first insulating layer 710. The first conductive layer 200 may include a first scan line 210 which transmits the first scan signal GW (e.g., see FIG. 3), a gate electrode 240 of the first transistor T1, an emission control line 220 which transmits the emission control signal EM (e.g., see FIG. 3), and a second scan line 230 which supplies the second scan signal GI (e.g., see FIG. 3).

The first scan line 210 may include the gate electrodes of the second transistor T2 and the second sub-transistor T3_2, and the emission control line 220 may include the gate electrode of the fifth transistor T5 and the gate electrode of the sixth transistor T6. In addition, the second scan line 230 may include the gate electrodes of the third sub-transistor T4_1, the fourth sub-transistor T4_2, and the seventh transistor T7.

Each of the first scan line 210, the emission control line 220, and the second scan line 230 may extend along the first direction DR1. Each of the first scan line 210, the emission control line 220, and the second scan line 230 may extend beyond the boundary of the pixel PX along the first direction DR1 to neighboring pixels PX.

The first scan line 210 may be located near the center of the pixel PX and may overlap the upper part 111 of the first vertical part 110 and the upper part 121 of the second vertical part 120 of the semiconductor layer 100.

The first scan line 210 may form the gate electrode of the second transistor T2 in a part overlapping the upper part 111 of the first vertical part 110 of the semiconductor layer 100. The first vertical part 110 of the semiconductor layer 100 located closer to the first side of the second direction DR2 than the overlapping area is to the first side of the second direction DR2 may be a first area of the second transistor T2, and the first vertical part 110 of the semiconductor layer 100 located closer to the second side of the second direction DR2 than the overlapping area is to the second side of the second direction DR2 may be a second area of the second transistor T2.

The first scan line 210 may form the gate electrode of the second sub-transistor T3_2 in a part overlapping the upper part 121 of the second vertical part 120 of the semiconductor layer 100. The second vertical part 120 of the semiconductor layer 100 located closer to the first side of the second direction DR2 than the overlapping area is to the first side of the second direction DR2 may be a second area of the second sub-transistor T3_2, and the second vertical part 120 of the semiconductor layer 100 located closer to the second side of the second direction DR2 than the overlapping area is to the second side of the second direction DR2 may be a first area of the second sub-transistor T3_2.

The emission control line 220 may be located on or at a second side of the pixel PX in the second direction DR2 in a plan view and may overlap the lower part 112 of the first vertical part 110 and the lower part 122 of the second vertical part 120 of the semiconductor layer 100.

The emission control line 220 may form the gate electrode of the fifth transistor T5 in a part overlapping the lower part 112 of the first vertical part 110 of the semiconductor layer 100. The first vertical part 110 of the semiconductor layer 100 located closer to the first side of the second direction DR2 than the overlapping area is to the first side of the second direction DR2 may be a second area of the fifth transistor T5, and the first vertical part 110 of the semiconductor layer 100 located closer to the second side of the second direction DR2 than the overlapping area is to the second side of the second direction DR2 may be a first area of the fifth transistor T5.

The emission control line 220 may form the gate electrode of the sixth transistor T6 in a part overlapping the upper part 121 of the second vertical part 120. The second vertical part 120 of the semiconductor layer 100 located closer to the first side of the second direction DR2 than the overlapping area is to the first side of the second direction DR2 may be a first area of the sixth transistor T6, and the second vertical part 120 of the semiconductor layer 100 located closer to the second side of the second direction DR2 than the overlapping area is to the second side of the second direction DR2 may be a second area of the sixth transistor T6.

The second scan line 230 may be located on or at a first side of the pixel PX in the second direction DR2 in a plan view and may overlap the third vertical part 150, the fourth vertical part 160, and the fifth vertical part 170 of the semiconductor layer 100.

The second scan line 230 may form the gate electrode of the third sub-transistor T4_1 in a part overlapping the third vertical part 150 of the semiconductor layer 100. The third vertical part 150 of the semiconductor layer 100 located closer to the first side of the second direction DR2 than the overlapping area is to the first side of the second direction DR2 may be a second area of the third sub-transistor T4_1, and the third vertical part 150 of the semiconductor layer 100 located closer to the second side of the second direction DR2 than the overlapping area is to the second side of the second direction DR2 may be a first area of the third sub-transistor T4_1.

The second scan line 230 may form the gate electrode of the fourth sub-transistor T4_2 in a part overlapping the fourth vertical part 160 of the semiconductor layer 100. The fourth vertical part 160 of the semiconductor layer 100 located closer to the first side of the second direction DR2 than the overlapping area is to the first side of the second direction DR2 may be a first area of the fourth sub-transistor T4_2, and the fourth vertical part 160 of the semiconductor layer 100 located closer to the second side of the second direction DR2 than the overlapping area is to the second side of the second direction DR2 may be a second area of the fourth sub-transistor T4_2.

The second scan line 230 may form the gate electrode of the seventh transistor T7 in a part overlapping the fifth vertical part 170 of the semiconductor layer 100. The fifth vertical part 170 of the semiconductor layer 100 located closer to the first side of the second direction DR2 than the overlapping area is to the first side of the second direction DR2 may be a second area of the seventh transistor T7, and the fifth vertical part 170 of the semiconductor layer 100 located closer to the second side of the second direction DR2 than the overlapping area is to the second side of the second direction DR2 may be a first area of the seventh transistor T7.

The gate electrode 240 of the first transistor T1 may be located in the center of the pixel PX. The gate electrode 240 of the first transistor T1 may be located between the first scan line 210 and the emission control line 220 in a plan view. The gate electrode 240 of the first transistor T1 may be separated for each pixel PX.

The gate electrode 240 of the first transistor T1 overlaps the first horizontal part 130 of the semiconductor layer 100. The first horizontal part 130 of the semiconductor layer 100 located closer to the second side of the first direction DR1 than the overlapping part is to the second side of the first direction DR1 may be a first area of the first transistor T1, and the first horizontal part 130 of the semiconductor layer 100 located closer to the first side of the first direction DR1 than the overlapping part is to the first side of the first direction DR1 may be a second area of the first transistor T1.

The first conductive layer 200 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second insulating layer 720 insulates the first conductive layer 200 from the second conductive layer 300. The second insulating layer 720 may be disposed on the first conductive layer 200 and may be generally disposed over a surface (e.g., an entire surface) of the first substrate SUB1 and the second substrate SUB2. The second insulating layer 720 may be an interlayer insulating film.

The second insulating layer 720 may include an inorganic insulating material such as silicon oxide, silicon nitride, silicon oxynitride, hafnium oxide, aluminum oxide, titanium oxide, tantalum oxide or zinc oxide or an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene (BCB).

The second conductive layer 300 is disposed on the second insulating layer 720. The second conductive layer 300 may include a capacitor electrode line 310, an initialization voltage line 320 which supplies the initialization voltage VINT (e.g., see FIG. 3), and a gate conductive pattern 330.

Each of the capacitor electrode line 310 and the initialization voltage line 320 may extend along the first direction DR1. Each of the capacitor electrode line 310 and the initialization voltage line 320 may extend beyond the boundary of the pixel PX along the first direction DR1 to the neighboring pixels PX.

The capacitor electrode line 310 crosses the center of the pixel PX and forms the capacitor Cst by overlapping the gate electrode 240 of the first transistor T1 thereunder with the second insulating layer 720 interposed therebetween. The gate electrode 240 of the first transistor T1 may be the first electrode of the capacitor Cst, an extended area of the capacitor electrode line 310 overlapping the gate electrode 240 of the first transistor T1 may be the second electrode of the capacitor Cst, and the second insulating layer 720 interposed therebetween may be a dielectric of the capacitor Cst.

A width of the capacitor electrode line 310 may be extended in the area overlapping the gate electrode 240 of the first transistor T1. The capacitor electrode line 310 may include an opening overlapping the gate electrode 240 of the first transistor T1 in the extended area (e.g., the area overlapping the gate electrode 240 of the first transistor T1). The gate electrode 240 of the first transistor T1 may be under the opening of the capacitor electrode line 310.

The initialization voltage line 320 may be located on or at the first side of the pixel PX in the second direction DR2 in a plan view. The initialization voltage line 320 may overlap the fifth vertical part 170 of the semiconductor layer 100.

The gate conductive pattern 330 may overlap the first scan line 210. The gate conductive pattern 330 may be connected (e.g., electrically connected) to the first scan line 210 through a contact hole CNT1 penetrating the second insulating layer 720 to expose the first scan line 210 in an area overlapping the first scan line 210.

The gate conductive pattern 330 may overlap the second horizontal part 140 of the semiconductor layer 100 and may form the gate electrode of the first sub-transistor T3_1 in the overlapping part. The second horizontal part 140 of the semiconductor layer 100 located closer to the first side of the first direction DR1 than the overlapping area is to the first side of the first direction DR1 may be a first area of the first sub-transistor T3_1, and the second horizontal part 140 of the semiconductor layer 100 located closer to the second side of the first direction DR1 than the overlapping area is to the second side of the first direction DR1 may be a second area of the first sub-transistor T3_1.

The gate electrode of the first sub-transistor T3_1 and the gate electrode of the second sub-transistor T3_2 may be formed of different conductive layers. In addition, the gate electrode of the first sub-transistor T3_1 and the gate electrode of the second sub-transistor T3_2 may be disposed on or at different layers from each other. The thickness of the gate insulating layer of the first sub-transistor T3_1 and the thickness of the gate insulating layer of the second sub-transistor T3_2 may be different from each other.

Figure 8:
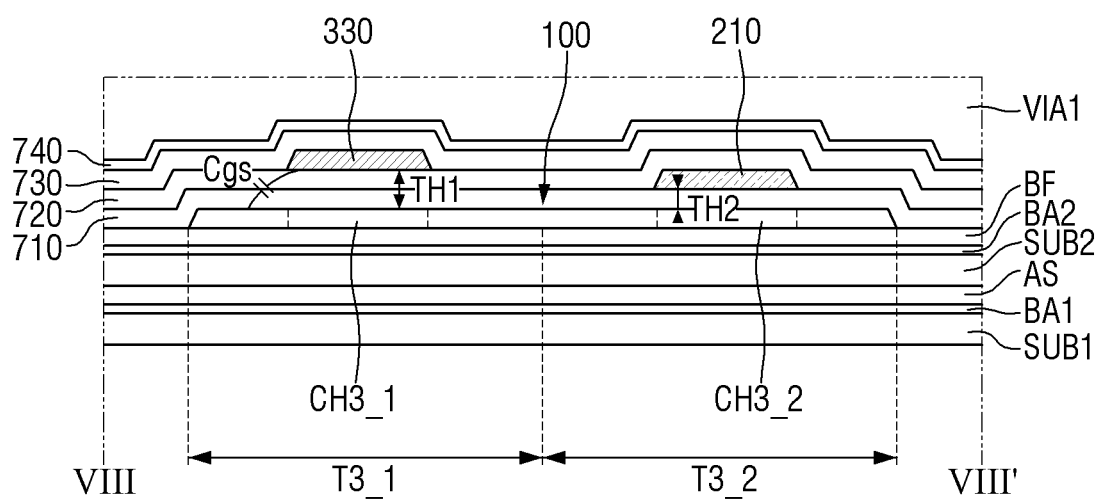
FIG. 8 is a part of a cross-sectional view taken along the line VIII-VIII' of FIG. 4.

FIG. 8 is a part of a cross-sectional view taken along the line VIII-VIII' of FIG. 4.

Referring further to FIG. 8, the gate electrode (e.g., the gate conductive pattern 330) of the first sub-transistor T3_1 and the gate electrode (e.g., the first scan line 210) of the second sub-transistor T3_2 may be formed of different conductive layers. In other words, the gate electrode of the first sub-transistor T3_1 may be formed of the second conductive layer 300, and the gate electrode of the second sub-transistor T3_2 may be formed of the first conductive layer 200.

The gate electrode of the first sub-transistor T3_1 and the gate electrode of the second sub-transistor T3_2 may be disposed on or at different layers from each other. In other words, the gate electrode of the first sub-transistor T3_1 may be on (e.g., directly disposed on) the second insulating layer 720 and may be disposed between the second insulating layer 720 and the third insulating layer 730. The gate electrode of the second sub-transistor T3_2 may be on (e.g., directly disposed on) the first insulating layer 710 and may be disposed between the first insulating layer 710 and the second insulating layer 720.

The thickness of the gate insulating layer of the first sub-transistor T3_1 may be greater than the thickness of the gate insulating layer of the second sub-transistor T3_2. In other words, the gate insulating layer of the first sub-transistor T3_1 located between the gate electrode of the first sub-transistor T3_1 and the semiconductor layer 100 (e.g., the channel CH3_1 of the first sub-transistor T3_1) may include a first thickness TH1, and the gate insulating layer of the second sub-transistor T3_2 located between the gate electrode of the second sub-transistor T3_2 and the semiconductor layer 100 (e.g., the channel CH3_2 of the second sub-transistor T3_2) may include a second thickness TH2.

In this case, the first thickness TH1 may be greater than the second thickness TH2. For example, the first thickness TH1 may be in the range of 1.1 to 10 times or 1.3 to 5 times the second thickness TH2 or may be twice the second thickness TH2, although the present disclosure is not limited thereto.

The gate insulating layer of the first sub-transistor T3_1 may include the first insulating layer 710 and the second insulating layer 720, and the gate insulating layer of the second sub-transistor T3_2 may include the first insulating layer 710. In other words, the gate insulating layer of the first sub-transistor T3_1 may include the same element (e.g., the first insulating layer 710) as the gate insulating layer of the second sub-transistor T3_2 but may further include the second insulating layer 720. Here, the gate insulating layer may refer to an insulating layer between the gate electrode of each of the sub-transistors T3_1 and T3_2 and the channel CH3_1 or CH3_2.

In other words, the first insulating layer 710 and the second insulating layer 720 may be disposed between the gate electrode (e.g., the gate conductive pattern 330) of the first sub-transistor T3_1 and the semiconductor layer 100 (e.g., the channel CH3_1 of the first sub-transistor T3_1), and the first insulating layer 710 may be disposed between the gate electrode (e.g., the first scan line 210) of the second sub-transistor T3_2 and the semiconductor layer 100 (e.g., the channel CH3_2 of the second sub-transistor T3_2).

A first electrode of the parasitic capacitor Cgs may be formed of the second area of the first sub-transistor T3_1 located on or at a side of the channel CH3_1 of the first sub-transistor T3_1, and a second electrode of the parasitic capacitor Cgs may be formed of the gate electrode (e.g., the gate conductive pattern 330) of the first sub-transistor T3_1. A dielectric of the parasitic capacitor Cgs may be formed of the first insulating layer 710 and the second insulating layer 720 located between the first electrode and the second electrode of the parasitic capacitor Cgs.

The magnitude of a kickback voltage due to the parasitic capacitor Cgs is generally proportional to the capacitance of the parasitic capacitor Cgs. The capacitance decreases as the distance between the two electrodes of the parasitic capacitor Cgs increases. In other words, because the gate electrode of the first sub-transistor T3_1 is disposed on the second insulating layer 720, the first thickness TH1 between the gate electrode of the first sub-transistor T3_1 and the channel CH3_1 may increase. Accordingly, the distance between the two electrodes of the parasitic capacitor Cgs may increase, and the capacitance of the parasitic capacitor Cgs may decrease. Therefore, the magnitude of the kickback voltage due to the parasitic capacitor Cgs may be reduced, and a change in the voltage applied to the gate electrode of the first transistor T1 due to the kickback of the parasitic capacitor Cgs may be suppressed or prevented. Further, because a voltage of a desired or suitable magnitude can be smoothly applied to the gate electrode of the first transistor T1, defects such as medium afterimages and/or long-term afterimages can be suppressed or prevented.

In addition, because the gate electrode of the second sub-transistor T3_2 is disposed on the first insulating layer 710, the second sub-transistor T3_2 may serve as a switching transistor more smoothly, thereby minimizing a reduction in switching transistor characteristics of the third transistor T3. In other words, a reduction in the switching transistor characteristics of the third transistor T3 is minimized or reduced by placing the gate electrode of the first sub-transistor T3_1 on the second insulating layer 720 to reduce the capacitance of the parasitic capacitor Cgs and placing the gate electrode of the second sub-transistor T3_2 on the first insulating layer 710.

A length of the gate electrode of the first sub-transistor T3_1 may be different from a length of the gate electrode of the second sub-transistor T3_2, and a width of the gate electrode of the first sub-transistor T3_1 may be different from a width of the gate electrode of the second sub-transistor T3_2.

Figure 9:
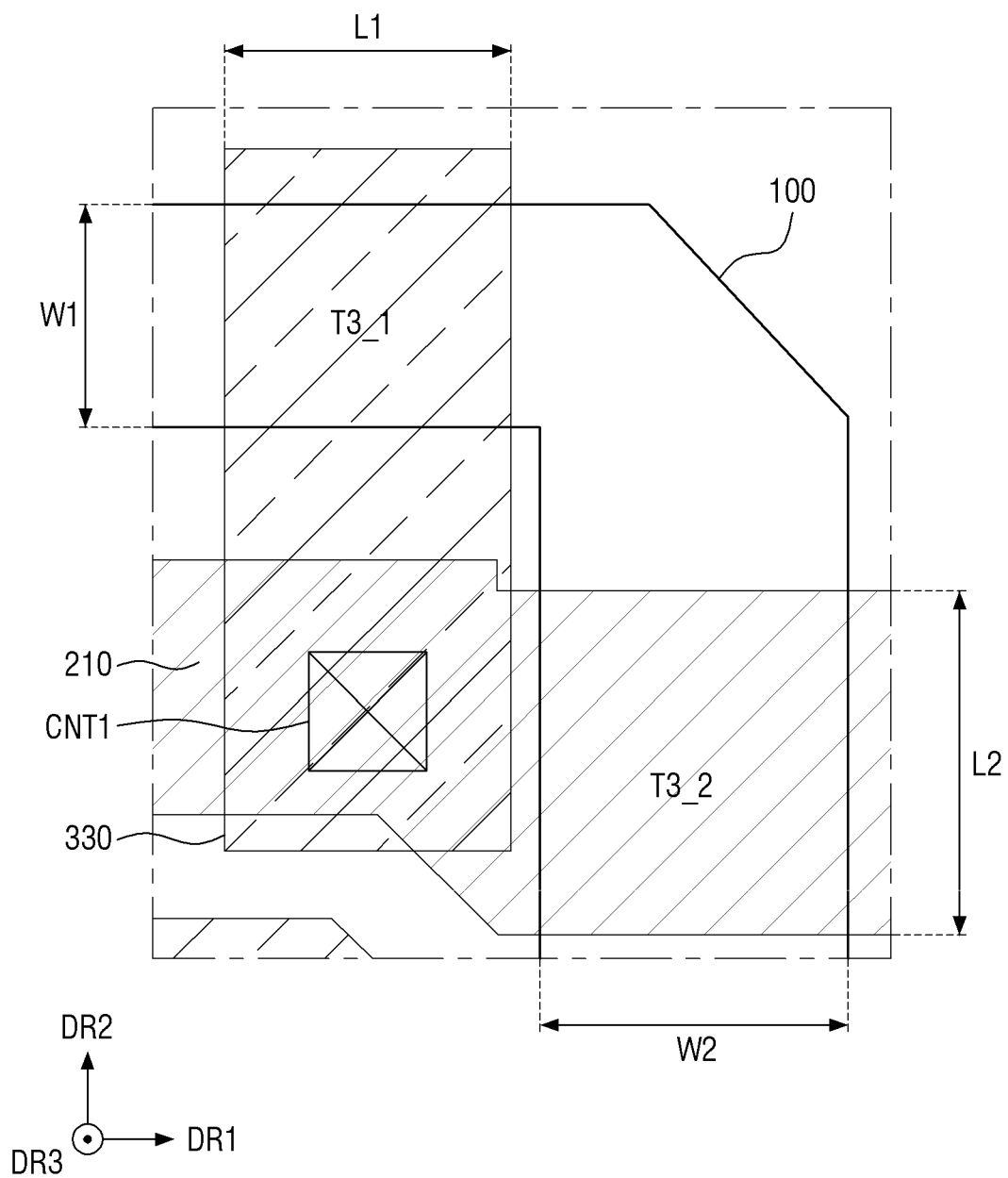
FIG. 9 is an enlarged view of a part of FIG. 4.

FIG. 9 is an enlarged view of a part of FIG. 4.

Referring further to FIG. 9, the length of the gate electrode of the first sub-transistor T3_1 may be smaller than the length of the gate electrode of the second sub-transistor T3_2, and the width of the gate electrode of the first sub-transistor T3_1 may be smaller than the width of the gate electrode of the second sub-transistor T3_2.

In other words, the gate electrode of the first sub-transistor T3_1 may include a first length L1 and a first width W1, and the gate electrode of the second sub-transistor T3_2 may include a second length L2 and a second width W2. Here, the length L1 or L2 of the gate electrode of each of the sub-transistors T3_1 and T3_2 refers to a length in the same direction (e.g., a direction from a source area to a drain area or vice versa) in which the semiconductor layer 100 extends, and the width W1 or W2 of the gate electrode of each of the sub-transistors T3_1 and T3_2 refers to a width in a direction intersecting the direction in which the semiconductor layer 100 extends. In addition, the length L1 or L2 of the gate electrode of each of the sub-transistors T3_1 and T3_2 may refer to a distance between a first area and a second area disposed on a side and the other side (e.g., disposed at opposite sides) of the channel of the sub-transistor T3_1 or T3_2.

For example, the first length L1 of the gate electrode of the first sub-transistor T3_1 may refer to a length in the first direction DR1, and the first width W1 of the gate electrode of the first sub-transistor T3_1 may refer to a width in the second direction DR2. In addition, the second length L2 of the gate electrode of the second sub-transistor T3_2 may refer to a length in the second direction DR2, and the second width W2 of the gate electrode of the second sub-transistor T3_2 may refer to a width in the first direction DR1.

The first length L1 of the gate electrode of the first sub-transistor T3_1 may be smaller than the second length L2 of the gate electrode of the second sub-transistor T3_2, and the first width W1 of the gate electrode of the first sub-transistor T3_1 may be smaller than the second width W2 of the gate electrode of the second sub-transistor T3_2.

Although the present disclosure is not limited to the following case, for example, the first length L1 of the gate electrode of the first sub-transistor T3_1 may be in the range of 0.1 nm to 3 nm or 1 nm to 2 nm or may be 1.5 nm. The first width W1 of the gate electrode of the first sub-transistor T3_1 may be in the range of 0.1 nm to 2.5 nm or 1 nm to 2 nm or may be 1.5 nm. The second length L2 of the gate electrode of the second sub-transistor T3_2 may be in the range of 2.5 nm to 5 nm or 3 nm to 4 nm or may be 3.25 nm. The second width W2 of the gate electrode of the second sub-transistor T3_2 may be in the range of 1 nm to 4 nm or 1.5 nm to 3 nm or may be 2.5 nm.

Accordingly, the capacitance of the parasitic capacitor Cgs may decrease. In other words, the capacitance decreases as an overlapping area of the two electrodes facing each other decreases. Therefore, when the first length L1 and the first width W1 of the gate electrode of the first sub-transistor T3_1 satisfy the above ranges, the capacitance of the parasitic capacitor Cgs may be reduced, and further, defects such as medium afterimages and/or long-term afterimages may be suppressed or prevented.

TABLE 1

|  | Width (μm) of gate electrode | Length(μm) of gate electrode | Fluorine doping | Medium/long-term ISFOM (dB) |
| --- | --- | --- | --- | --- |
| Comparative Example | 2.5 | 3.25(+3.25) | X | −63.5 |
| Example 1 | 1.5 | 1.5 | X | −25.3 |
| Example 2 | 1.5 | 1.5 | ○ | −12.43 |

Referring to Table 1, in the Comparative Example, the first width W1 of the gate electrode of the first sub-transistor T3_1 and the second width W2 of the gate electrode of the second sub-transistor T3_2 are 2.5 μm, and the first length L1 of the gate electrode of the first sub-transistor T3_1 and the second length L2 of the gate electrode of the second sub-transistor T3_2 are 3.25 μm. In Examples 1 and 2, the first width W1 of the gate electrode of the first sub-transistor T3_1 and the second width W2 of the gate electrode of the second sub-transistor T3_2 are 1.5 μm, and the first length L1 of the gate electrode of the first sub-transistor T3_1 and the second length L2 of the gate electrode of the second sub-transistor T3_2 are 1.5 μm. In Example 1, the semiconductor layer 100 was not doped with fluorine. However, in Example 2, the semiconductor layer 100 was doped with fluorine.

Referring to the Comparative Example and Example 1, it can be seen that the medium/long-term ISFOM is improved when the widths and lengths of the gate electrodes of the first sub-transistor T3_1 and the second sub-transistor T3_2 are reduced. Therefore, it can be seen that even if the first length L1 and the first width W1 of the gate electrode of the first sub-transistor T3_1 among the first sub-transistor T3_1 and the second sub-transistor T3_2 include the length and width of Example 1, and the second length L2 and the second width W2 of the gate electrode of the second sub-transistor T3_2 include the length and width of the Comparative Example, the medium/long-term ISFOM may be improved. In other words, even if the first length L1 and the first width W1 of the gate electrode of the first sub-transistor T3_1 satisfy the above ranges, and the second length L2 and the second width W2 of the gate electrode of the second sub-transistor T3_2 satisfy the above ranges, the medium/long-term ISFOM can be improved.

In addition, referring to Examples 1 and 2, it can be seen that the medium/long-term ISFOM is improved when the semiconductor layer 100 is doped with fluorine.

Referring again to FIGS. 4 and 5, the second conductive layer 300 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The third insulating layer 730 covers the second conductive layer 300. The third insulating layer 730 may be generally disposed over a surface (e.g., an entire surface) of the first substrate SUB1 and the second substrate SUB2. The third insulating layer 730 may be an interlayer insulating film. The third insulating layer 730 may include the same material as the second insulating layer 720 or may include one or more materials selected from the materials exemplified as the constituent material of the second insulating layer 720.

The third conductive layer 400 is disposed on the third insulating layer 730. The third conductive layer 400 may include a plurality of data patterns 410 and 420, a first anode connection electrode 430 which connects (e.g., electrically connects) the anode ANO of the light emitting element EL (e.g., see FIG. 3) and the semiconductor layer 100, a first power voltage line 440 which supplies the first power voltage ELVDD (e.g., see FIG. 3), and a data line 450 which transmits the data signal DATA (e.g., see FIG. 3).

The third conductive layer 400 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer 400 may be a single layer or a multilayer. For example, the third conductive layer 400 may have a stacked structure of Ti/Al/Ti, Mo/Al/Mo, Mo/AlGe/Mo, or Ti/Cu.

The data patterns may include a first data pattern 410 and a second data pattern 420. Each of the data patterns 410 and 420 may generally extend in the second direction DR2, and a length of each of the data patterns 410 and 420 in the second direction DR2 may be smaller than a length of the pixel PX in the second direction DR2. The data patterns 410 and 420 may be spaced (e.g., physically spaced) from each other. Each of the data patterns 410 and 420 may connect (e.g., electrically connect) parts spaced from each other.

The first data pattern 410 may overlap the gate electrode 240 of the first transistor T1. In the overlapping area, the first data pattern 410 may be connected (e.g., electrically connected) to the gate electrode 240 of the first transistor T1 through a contact hole CNT2 penetrating the third insulating layer 730 and the second insulating layer 720 to expose the gate electrode 240 of the first transistor T1. The contact hole CNT2 may be located in the opening of the capacitor electrode line 310. The first data pattern 410 in the contact hole CNT2 and the capacitor electrode line 310 adjacent to the first data pattern 410 may be insulated from each other by the third insulating layer 730.

In addition, the first data pattern 410 may extend upward from the area overlapping the gate electrode 240 of the first transistor T1 to cross the first scan line 210 while being insulated from the first scan line 210 and may overlap a part of the second horizontal part 140 of the semiconductor layer 100. In the overlapping area, the first data pattern 410 may be connected (e.g., electrically connected) to the second horizontal part 140 of the semiconductor layer 100 through a contact hole CNT3 penetrating the third insulating layer 730, the second insulating layer 720 and the first insulating layer 710 to expose a part of the second horizontal part 140 of the semiconductor layer 100. The part of the second horizontal part 140 may be, but is not limited to, the second area of the first sub-transistor T3_1.

In other words, the first data pattern 410 may connect (e.g., electrically connect) the gate electrode 240 of the first transistor T1 and the second horizontal part 140 of the semiconductor layer 100.

The second data pattern 420 may overlap the third connection part 183 of the semiconductor layer 100. In the overlapping area, the second data pattern 420 may be connected (e.g., electrically connected) to the third connection part 183 of the semiconductor layer 100 through a contact hole CNT5 penetrating the third insulating layer 730, the second insulating layer 720 and the first insulating layer 710 to expose the third connection part 183 of the semiconductor layer 100.

In addition, the second data pattern 420 may extend upward from the area overlapping the third connection part 183 of the semiconductor layer 100 to cross the second scan line 230 while being insulated from the second scan line 230 and may overlap the initialization voltage line 320. In the overlapping area, the second data pattern 420 may be connected (e.g., electrically connected) to the initialization voltage line 320 through a contact hole CNT6 penetrating the third insulating layer 730 to expose the initialization voltage line 320.

In other words, the second data pattern 420 may connect (e.g., electrically connect) the third connection part 183 of the semiconductor layer 100 and the initialization voltage line 320.

The first anode connection electrode 430 generally extends in the second direction DR2, but a length of the first anode connection electrode 430 in the second direction DR2 is smaller than the length of the pixel PX in the second direction DR2. The first anode connection electrode 430 is spaced (e.g., physically spaced) from the data patterns 410 and 420. The first anode connection electrode 430 may connect the semiconductor layer 100 to the anode ANO together with the second anode connection electrode 500 to be described later.

The first anode connection electrode 430 may overlap the lower part 122 of the second vertical part 120 of the semiconductor layer 100. The first anode connection electrode 430 may be connected (e.g., electrically connected) to the lower part 122 of the second vertical part 120 of the semiconductor layer 100 through a contact hole CNT7 penetrating the third insulating layer 730, the second insulating layer 720 and the first insulating layer 710 to expose the lower part 122 of the second vertical part 120 of the semiconductor layer 100.

The first power voltage line 440 may extend along the second direction DR2. The first power voltage line 440 may extend beyond the boundary of the pixel PX along the second direction DR2 to neighboring pixels PX. The first power voltage line 440 may be generally disposed adjacent to a left side of the pixel PX but may be disposed on a first side of the data line 450 in the first direction DR1. However, the present disclosure is not limited thereto. The first power voltage line 440 may be connected (e.g., electrically connected) to the capacitor electrode line 310 through a contact hole CNT9 penetrating the third insulating layer 730 to expose the capacitor electrode line 310.

In addition, the first power voltage line 440 may be connected (e.g., electrically connected) to the lower part 112 of the first vertical part 110 of the semiconductor layer 100 through a contact hole CNT8 penetrating the third insulating layer 730, the second insulating layer 720 and the first insulating layer 710 to expose the lower part 112 of the first vertical part 110 of the semiconductor layer 100.

The data line 450 may extend along the second direction DR2. The data line 450 may extend beyond the boundary of the pixel PX along the second direction DR2 to the neighboring pixels PX. The data line 450 may be disposed adjacent to the second side of the pixel PX in the first direction DR1. The data line 450 may overlap the first vertical part 110 of the semiconductor layer 100.

The data line 450 may contact the upper part 111 of the first vertical part 110 of the semiconductor layer 100 through a contact hole CNT4 penetrating the third insulating layer 730, the second insulating layer 720 and the first insulating layer 710 to expose the upper part 111 of the first vertical part 110 of the semiconductor layer 100. The contact hole CNT4 may be located adjacent or below the second scan line 230 in a plan view (i.e., the second scan line 230 may be above the contact hole CNT4 in the second direction DR2), but the present disclosure is not limited thereto.

The protective layer 740 may be formed on the third conductive layer 400. The protective layer 740 may be made of an inorganic layer, for example, a silicon nitride layer, a silicon oxynitride layer, a silicon oxide layer, a titanium oxide layer, or an aluminum oxide layer. However, in some embodiments, the protective layer 740 may be omitted.

The first via layer VIA1 is disposed on the protective layer 740. The first via layer VIA1 may be a planarization layer. The first via layer VIA1 may include an inorganic insulating material and/or an organic insulating material such as polyacrylates resin, epoxy resin, phenolic resin, polyamides resin, polyimides resin, unsaturated polyesters resin, polyphenylenethers resin, polyphenylenesulfides resin and/or benzocyclobutene (BCB).

The second anode connection electrode 500 is disposed on the first via layer VIA1. The second anode connection electrode 500 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

A contact hole CNT10 may be disposed in the first via layer VIA1 to penetrate the first via layer VIA1 and the protective layer 740 and expose the first anode connection electrode 430. The second anode connection electrode 500 may be connected to the first anode connection electrode 430 through the contact hole CNT10.

The second via layer VIA2 is disposed on the second anode connection electrode 500. The second via layer VIA2 may be a planarization layer. The second via layer VIA2 may include an inorganic insulating material or an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene (BCB).

The anode ANO may be disposed on the second via layer VIA2. The anode ANO may be disposed separately for each pixel PX. The anode ANO may be connected (e.g., electrically connected) to the second anode connection electrode 500 through a contact hole CNT11 penetrating the second via layer VIA2 to expose the second anode connection electrode 500.

The anode ANO may have, but is not limited to, a stacked structure in which a material layer having a high work function such as indium tin oxide (ITO), indium zinc oxide (IZO), zinc oxide (ZnO) or indium oxide ($In_2O_3$) and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture of the same are stacked. The material layer having a high work function may be disposed on the reflective material layer so that it is close to the light emitting layer EL. The anode ANO may have, but is not limited to, a multilayer structure of ITO/Mg, ITO/MgF, ITO/Ag, or ITO/Ag/ITO.

The pixel defining layer PDL may be disposed on the anode ANO. The pixel defining layer PDL may include an opening that partially exposes the anode ANO. The pixel defining layer PDL may be made of an organic insulating material or an inorganic insulating material. For example, the pixel defining layer PDL may include at least one of polyimide resin, acrylic resin, a silicone compound, and polyacrylic resin.

The light emitting layer EL is disposed on the anode ANO exposed by the pixel defining layer PDL. The light emitting layer EL may include an organic material layer. The organic material layer of the light emitting layer EL may include an organic light emitting layer and may further include a hole injection/transport layer and/or an electron injection/transport layer.

The cathode CAT may be disposed on the light emitting layer EL. The cathode CAT may be a common electrode disposed over a surface (e.g., an entire surface) without distinction between the pixels PX. The anode ANO, the light emitting layer EL and the cathode CAT may constitute an organic light emitting element.

The cathode CAT may include a material layer having a small work function, such as Li, Ca, LiF/Ca, LiF/Al, Al, Mg, Ag, Pt, Pd, Ni, Au Nd, Ir, Cr, BaF, Ba, or a compound or mixture of the same (e.g., a mixture of Ag and Mg). The cathode CAT may further include a transparent metal oxide layer disposed on the material layer having a small work function.

The thin-film encapsulation layer 770 including a first inorganic layer 771, a first organic layer 772 and a second inorganic layer 773 is disposed on the cathode CAT. The first inorganic layer 771 and the second inorganic layer 773 may contact each other at an end of the thin-film encapsulation layer 770. The first organic layer 772 may be sealed by the first inorganic layer 771 and the second inorganic layer 773.

Each of the first inorganic layer 771 and the second inorganic layer 773 may include silicon nitride, silicon oxide, and/or silicon oxynitride. The first organic layer 772 may include an organic insulating material.

A method of manufacturing a display device will now be described.

Figure 10:
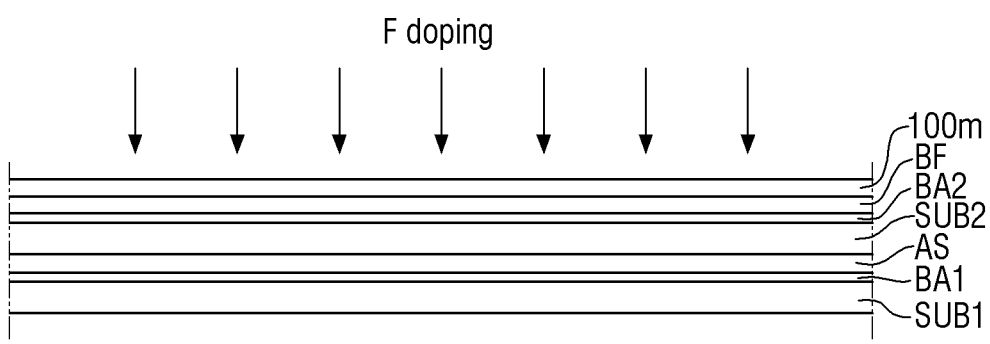
FIGS. 10-12 are cross-sectional views illustrating operations in a method of manufacturing a display device according to one or more embodiments.
Figure 11:
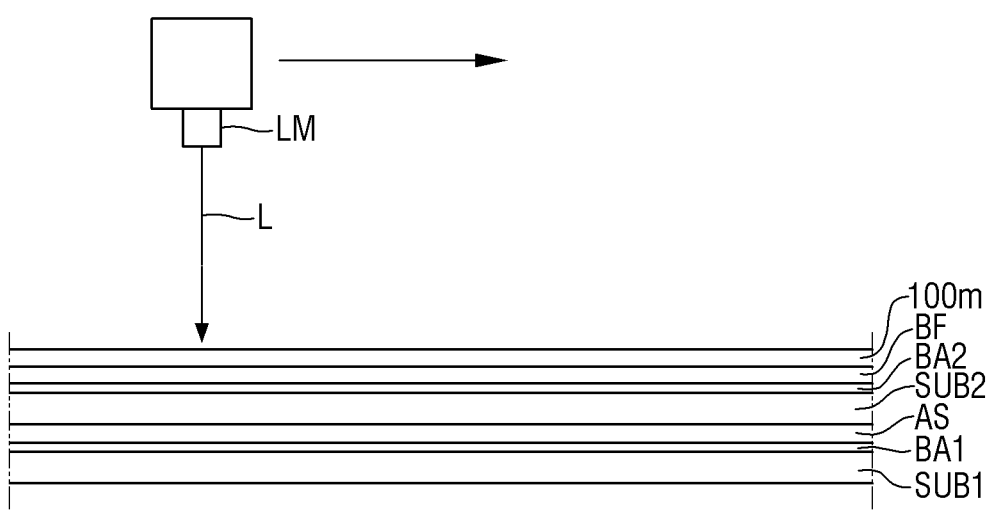
Figure 12:
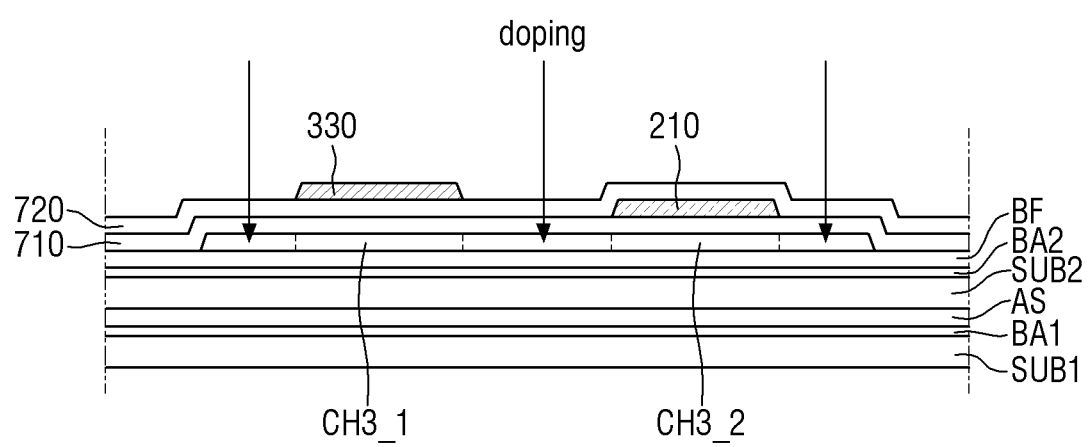

FIGS. 10-12 are cross-sectional views illustrating operations in a method of manufacturing a display device according to one or more embodiments.

Referring to FIG. 10, a first substrate SUB1, a first barrier layer BA1, a lower semiconductor layer AS, a second substrate SUB2, a second barrier layer BA2, and a buffer layer BF stacked (e.g., sequentially stacked) are prepared, and a material layer 100*m* for a semiconductor layer is deposited on a surface (e.g., an entire surface) of the buffer layer BF. Then, the material layer 100*m* for the semiconductor layer is doped with impurity ions (e.g., fluorine). The material layer 100*m* for the semiconductor layer may include amorphous silicon.

Next, referring to FIG. 11, excimer laser annealing (ELA) is performed on the material layer 100*m* for the semiconductor layer doped with fluorine. In other words, a laser module LM may irradiate the material layer 100*m* with a laser beam L and may be moved. The laser beam L may reach the material layer 100*m* for the semiconductor layer, in which case the amorphous silicon of the material layer 100*m* for the semiconductor layer may be crystallized into crystalline silicon. The fluorine doped into the material layer 100*m* for the semiconductor layer may be concentrated downward during the crystallization of the amorphous silicon of the material layer 100*m* for the semiconductor layer.

Next, referring to FIG. 12, the material layer 100*m* for the semiconductor layer is patterned through a photolithography process to form a patterned semiconductor layer as illustrated in FIG. 12.

Then, a first insulating layer 710 is deposited on a surface (e.g., an entire surface), and a first conductive layer 200

(e.g., see FIG. 4) is formed. The first conductive layer 200 (e.g., see FIG. 4) may be formed as illustrated in FIG. 4 by depositing a material layer for a first conductive layer on a surface (e.g., an entire surface) and then patterning the material layer for the first conductive layer through a photolithography process. In this process, a first scan line 210 may be formed.

Next, a second insulating layer 720 is deposited on a surface (e.g., an entire surface), and a second conductive layer 300 (e.g., see FIG. 4) is formed. The second conductive layer 300 (e.g., see FIG. 4) may be formed as illustrated in FIG. 4 by depositing a material layer for a second conductive layer on a surface (e.g., an entire surface) and then patterning the material layer for the second conductive layer through a photolithography process. In this process, a gate conductive pattern 330 may be formed.

Next, the semiconductor layer 100 is P+-doped. The impurity ions doped into the semiconductor layer 100 may be, but are not limited to, boron (B). In this case, the first conductive layer 200 (e.g., see FIG. 4) and the second conductive layer 300 (e.g., see FIG. 4) themselves may serve as a mask. Therefore, the semiconductor layer 100 may be doped in a part not overlapping the first conductive layer 200 (e.g., see FIG. 4) and the second conductive layer 300 (e.g., see FIG. 4) and may not be doped in a part overlapping the first conductive layer 200 (e.g., see FIG. 4) and the second conductive layer 300 (e.g., see FIG. 4). The undoped part of the semiconductor layer 100 may include a channel of each of transistors T1 through T7 (e.g., see FIG. 4).

For example, the semiconductor layer 100 overlapping the first scan line 210 and the gate conductive pattern 330 may not be P+-doped. The undoped area of the semiconductor layer 100 may include a channel CH3_1 of a first sub-transistor T3_1 (e.g., see FIG. 14) and a channel CH3_2 of a second sub-transistor T3_2 (e.g., see FIG. 14).

Hereinafter, other embodiments will be described. In the following embodiments, a description of the same elements as those of the above-described embodiment may not be repeated or may be described briefly, and differences will be primarily described.

Figure 13:
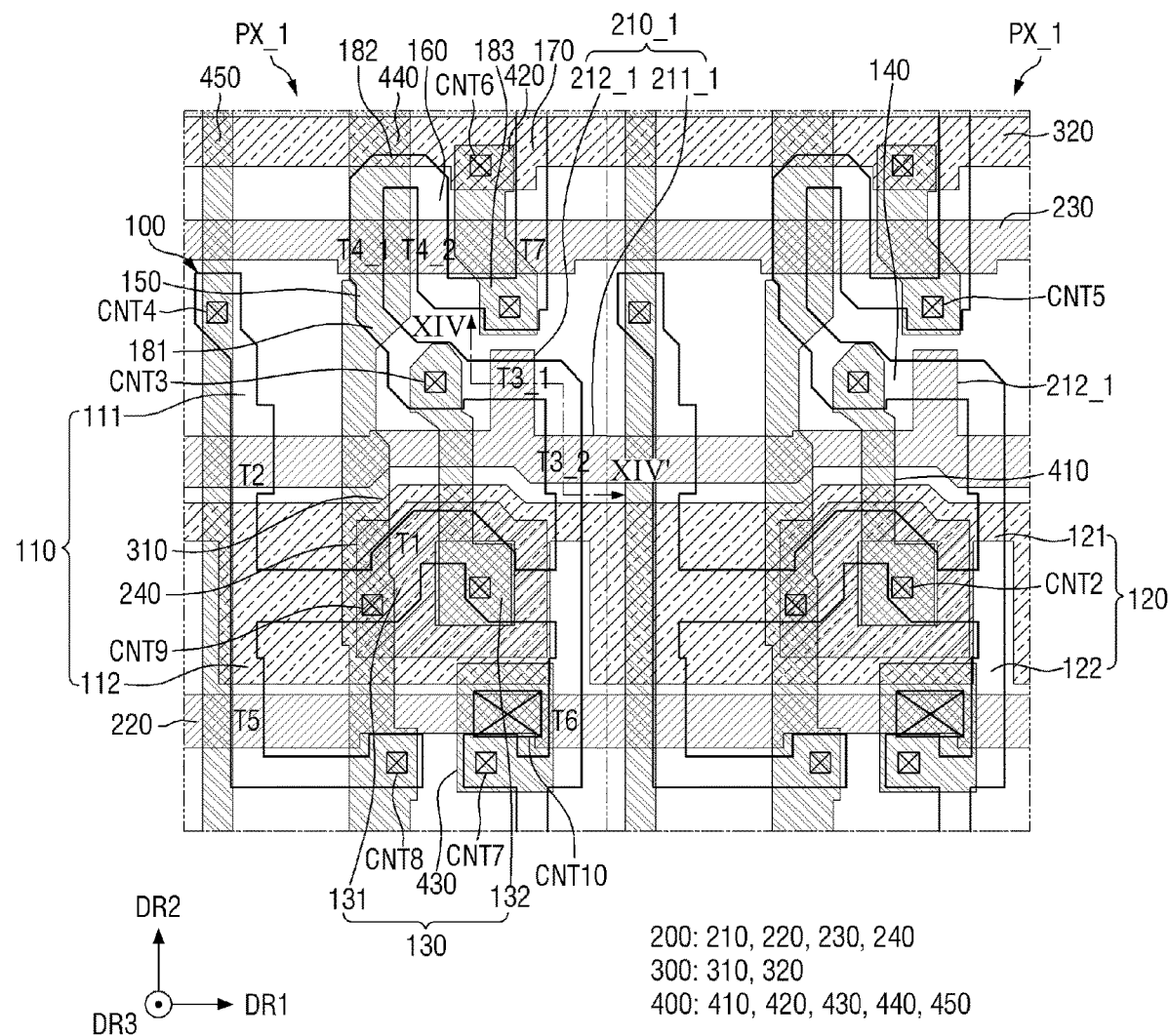
FIG. 13 is a layout view of pixels of a display device according to one or more embodiments.
Figure 14:
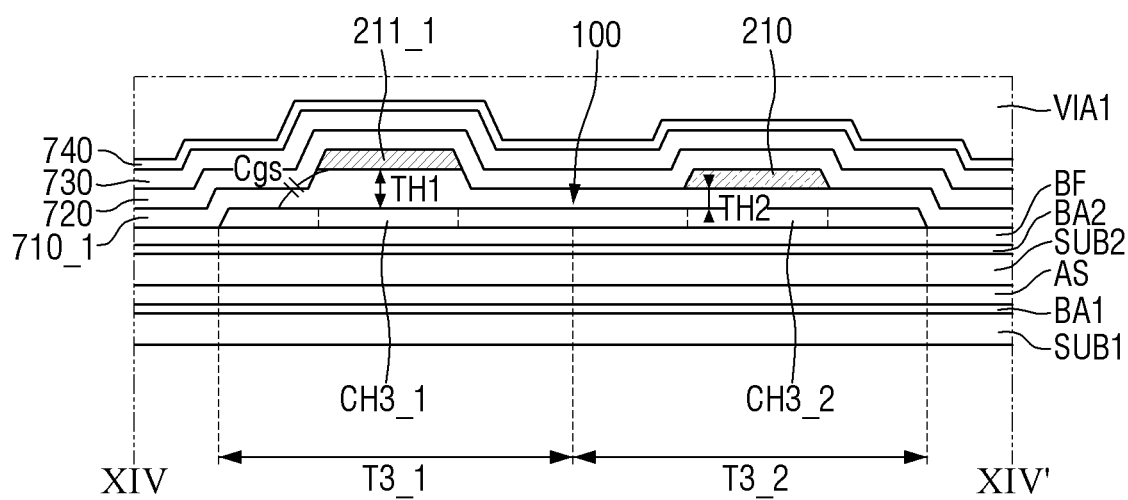
FIG. 14 is a cross-sectional view taken along the line XIV-XIV' of FIG. 13.

FIG. 13 is a layout view of pixels of a display device according to one or more embodiments. FIG. 14 is a cross-sectional view taken along the line XIV-XIV' of FIG. 13.

Referring to FIGS. 13 and 14, the current embodiment is different from the embodiment of FIGS. 4 and 8 in that a gate electrode of a first sub-transistor T3_1 and a gate electrode of a second sub-transistor T3_2 in a pixel PX_1 are formed of the same conductive layer.

Specifically, a first scan line 210_1 may include a base part 211_1 extending in the first direction DR1 and a protruding part 212_1 protruding toward the first side of the second direction DR2 from the base part 211_1. The base part 211_1 may include the gate electrode of the second sub-transistor T3_2, and the protruding part 212_1 may include the gate electrode of the first sub-transistor T3_1. The gate electrode of the first sub-transistor T3_1 and the gate electrode of the second sub-transistor T3_2 may be formed of the same conductive layer (a first conductive layer 200). The gate electrode of the first sub-transistor T3_1 and the gate electrode of the second sub-transistor T3_2 may be disposed on the same layer.

A gate insulating layer of the first sub-transistor T3_1 and a gate insulating layer of the second sub-transistor T3_2 may be formed of the same insulating layer (e.g., a first insulating layer 710_1). In this case, a thickness (e.g., a first thickness TH1) of the gate insulating layer of the first sub-transistor T3_1 may be greater than a thickness (e.g., a second thickness TH2) of the gate insulating layer of the second sub-transistor T3_2. In this case, the first insulating layer 710_1 may be thicker in a part overlapping the gate of the first sub-transistor T3_1 than in a part overlapping the gate of the second sub-transistor T3_2. The first insulating layer 710_1 including different thicknesses may be formed through a half-tone mask or the like.

Even in this case, because the thickness of the gate insulating layer of the first sub-transistor T3_1 is greater than the thickness of the gate insulating layer of the second sub-transistor T3_2, the size of a parasitic capacitor Cgs can be reduced, and a kickback phenomenon can be suppressed or prevented. Furthermore, a medium/long-term ISFOM can be improved, and display quality of the display device can be improved. In addition, because the gate electrode of the first sub-transistor T3_1 and the gate electrode of the second sub-transistor T3_2 may be formed of the same conductive layer, the pixel PX_1 can be configured to have various suitable structures as desired.

Figure 15:
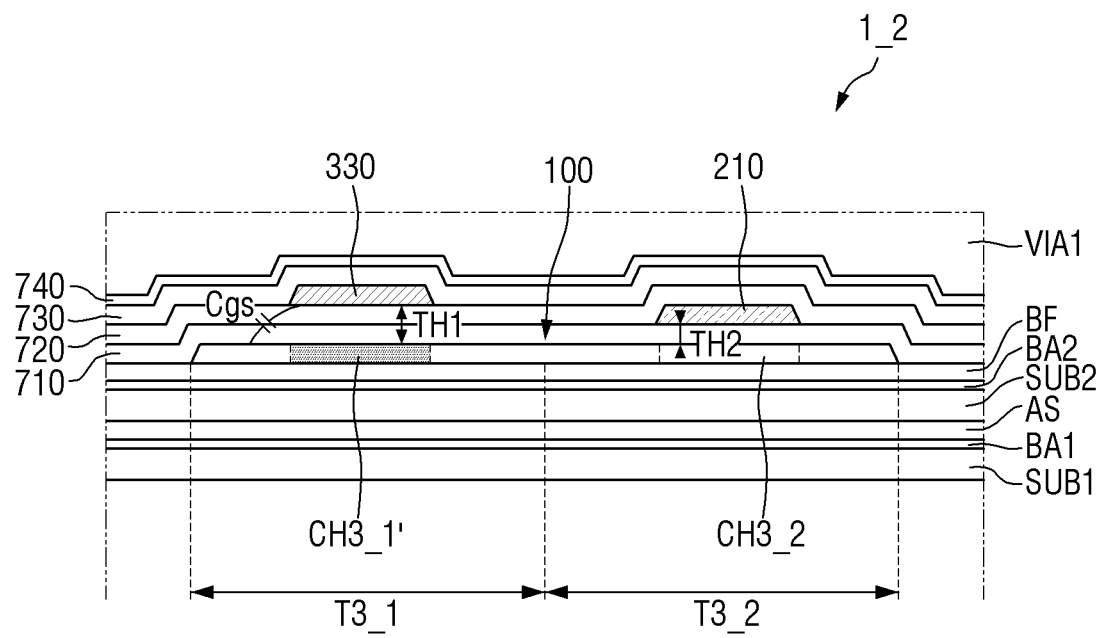
FIG. 15 is a cross-sectional view of a display device according to one or more embodiments.

FIG. 15 is a cross-sectional view of a display device 1_2 according to one or more embodiments.

Referring to FIG. 15, the display device 1_2 according to the current embodiment is different from the embodiment of FIG. 8 in that a channel doping concentration of a channel region CH3_1' of a first sub-transistor T3_1 is smaller than a channel doping concentration of a channel region CH3_2 of a second sub-transistor T3_2.

The channel doping concentration of the channel region CH3_1' of the first sub-transistor T3_1 may be in the range of 9/10 to 1/100 or 2/3 to 1/10 of the channel doping concentration of the channel region CH3_2 of the second sub-transistor T3_2. Chanel doping ions doped into the channel region CH3_1' of the first sub-transistor T3_1 and the channel region CH3_2 of the second sub-transistor T3_2 may be a trivalent dopant. For example, the channel doping ions may be, but are not limited to, boron (B).

Likewise, the channel doping concentration of the channel region CH3_1' of the first sub-transistor T3_1 may be smaller than the concentration of channel doping ions doped into channel regions of the other transistors T1 through T7.

Even in this case, because a thickness of a gate insulating layer of the first sub-transistor T3_1 is greater than a thickness of a gate insulating layer of the second sub-transistor T3_2, the size of a parasitic capacitor Cgs can be reduced, and a kickback phenomenon can be suppressed or prevented. Furthermore, a medium/long-term ISFOM can be improved, and display quality of the display device 1_2 can be improved. In addition, when the channel doping concentration of the channel region CH3_1' of the first sub-transistor T3_1 is relatively small, even if the thickness of the gate insulating layer of the first sub-transistor T3_1 is greater than the thickness of the gate insulating layer of the second sub-transistor T3_2, gate control power similar to that of the second sub-transistor T3_2 can be secured.

In a display device according to one or more embodiments of the present disclosure, the medium/long-term ISFOM can be improved.

In concluding the detailed description, those skilled in the art will appreciate that suitable variations and modifications can be made to the embodiments without departing from the spirit and scope of the present disclosure as set forth in the following claims and their equivalents. Therefore, the disclosed embodiments of the present disclosure are used in a generic and descriptive sense only and not for purposes of limitation.

What is claimed is:

1. A display device comprising:
   a first transistor configured to control a driving current flowing from a first electrode to a second electrode according to a voltage applied to a gate electrode of the first transistor; and
   a second transistor between the second electrode of the first transistor and the gate electrode of the first transistor, the second transistor comprising a first sub-transistor and a second sub-transistor,
   wherein a same scan signal is to be transmitted to a gate electrode of the first sub-transistor and a gate electrode of the second sub-transistor,
   wherein the gate electrode of the second sub-transistor is at a layer different from the gate electrode of the first sub-transistor,
   wherein a gate insulating layer of the first sub-transistor comprises a first thickness, and
   wherein a gate insulating layer of the second sub-transistor comprises a second thickness smaller than the first thickness.

2. The display device of claim 1, wherein the gate electrode of the first sub-transistor is formed of a first conductive layer, and
   wherein the gate electrode of the second sub-transistor is formed of a second conductive layer different from the first conductive layer.

3. The display device of claim 2, wherein the gate insulating layer of the first sub-transistor and the gate insulating layer of the second sub-transistor comprise a first insulating layer, and
   wherein the gate insulating layer of the first sub-transistor further comprises a second insulating layer.

4. The display device of claim 1, wherein the gate electrode of the first sub-transistor and the gate electrode of the second sub-transistor are at a same layer.

5. The display device of claim 1, wherein the second sub-transistor is between the first electrode of the first sub-transistor and the second electrode of the first transistor.

6. The display device of claim 1, wherein the gate electrode of the first sub-transistor comprises a first length, and
   wherein the gate electrode of the second sub-transistor comprises a second length greater than the first length.

7. The display device of claim 6, wherein the gate electrode of the first sub-transistor comprises a first width, and
   wherein the gate electrode of the second sub-transistor comprises a second width greater than the first width.

8. The display device of claim 1, wherein the first transistor comprises a channel region comprising impurity ions, a first area, and a second area, the first area and the second area being located sequentially in a thickness direction, and
   wherein a concentration of the impurity ions in the channel region of the first transistor has a highest point in the first area and a lowest point in the second area.

9. The display device of claim 8, wherein the concentration of the impurity ions increases from the lowest point toward the highest point, and
   wherein the impurity ions comprise fluorine.

10. The display device of claim 9, wherein the highest point of the concentration of the impurity ions is located at a lower surface of the channel region of the first transistor.

11. The display device of claim 1, further comprising a third transistor electrically connected to the first electrode of the first transistor, the third transistor being configured to transmit a data signal to the first transistor.

12. The display device of claim 11, further comprising a light emitting element electrically connected to the second electrode of the first transistor, the light emitting element being configured to emit light according to the driving current.

13. A display device comprising:
   a first transistor configured to control a driving current flowing from a first electrode to a second electrode according to a voltage applied to a gate electrode of the first transistor; and
   a second transistor between the second electrode of the first transistor and the gate electrode of the first transistor, the second transistor comprises a first sub-transistor and a second sub-transistor,
   wherein a same scan signal is to be transmitted to a gate electrode of the first sub-transistor and a gate electrode of the second sub-transistor,
   wherein the gate electrode of the second sub-transistor is at a layer different from the gate electrode of the first sub-transistor,
   wherein the gate electrode of the first sub-transistor is formed of a first conductive layer, and
   wherein the gate electrode of the second sub-transistor is formed of a second conductive layer different from the first conductive layer.

14. The display device of claim 13, wherein a gate insulating layer of the first sub-transistor comprises a first thickness, and
   wherein a gate insulating layer of the second sub-transistor comprises a second thickness smaller than the first thickness.

15. The display device of claim 14, wherein the gate insulating layer of the first sub-transistor and the gate insulating layer of the second sub-transistor comprise a first insulating layer, and
   wherein the gate insulating layer of the first sub-transistor further comprises a second insulating layer.

16. The display device of claim 15, wherein the gate electrode of the first sub-transistor and the gate electrode of the second sub-transistor are at different layers from each other.

17. A display device comprising:
   a substrate;
   a semiconductor layer on the substrate, the semiconductor layer comprising a first channel region of a first sub-transistor and a second channel region of a second sub-transistor;
   a first insulating layer on the semiconductor layer;
   a gate electrode of the second sub-transistor on the first insulating layer;
   a second insulating layer on the gate electrode of the second sub-transistor; and
   a gate electrode of the first sub-transistor on the second insulating layer,
   wherein a same scan signal is to be transmitted to the gate electrode of the first sub-transistor and the gate electrode of the second sub-transistor.

18. The display device of claim 17, wherein a thickness between the first channel region of the first sub-transistor and the gate electrode of the first sub-transistor is greater than a thickness between the second channel region of the second sub-transistor and the gate electrode of the second sub-transistor.

19. The display device of claim 18, wherein the gate electrode of the first sub-transistor and the gate electrode of the second sub-transistor are at different layers from each other.

20. The display device of claim 17, further comprising a first transistor configured to control a driving current flowing from a first electrode to a second electrode according to a voltage applied to a gate electrode of the first transistor,
- wherein the first sub-transistor is between the second electrode of the first transistor and the gate electrode of the first transistor, and
- wherein the second sub-transistor is between the first electrode of the first sub-transistor and the second electrode of the first transistor.

* * * * *